(12) United States Patent
Choi et al.

(10) Patent No.: US 12,272,596 B2
(45) Date of Patent: Apr. 8, 2025

(54) METHOD OF MANUFACTURING SEMICONDUCTOR DEVICES

(71) Applicant: SAMSUNG ELECTRONICS CO., LTD., Suwon-si (KR)

(72) Inventors: Junghyuck Choi, Suwon-si (KR); Dasol Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 593 days.

(21) Appl. No.: 17/583,783

(22) Filed: Jan. 25, 2022

(65) Prior Publication Data

US 2022/0375786 A1   Nov. 24, 2022

(30) Foreign Application Priority Data

May 4, 2021   (KR) .......................... 10-2021-0057891

(51) Int. Cl.
*H01L 21/768* (2006.01)
*H01L 21/308* (2006.01)
*H01L 23/528* (2006.01)

(52) U.S. Cl.
CPC .... *H01L 21/76816* (2013.01); *H01L 21/3086* (2013.01); *H01L 21/76877* (2013.01); *H01L 23/5286* (2013.01)

(58) Field of Classification Search
CPC ........... H01L 21/76816; H01L 21/3086; H01L 21/76877; H01L 21/0334; H01L 21/0337
See application file for complete search history.

(56) References Cited

U.S. PATENT DOCUMENTS

| | | | |
|---|---|---|---|
| 9,551,923 B2 | 1/2017 | Wang et al. | |
| 9,768,025 B2* | 9/2017 | Siew | ............... H01L 21/0337 |
| 9,887,209 B2 | 2/2018 | Gupta et al. | |
| 9,911,604 B1* | 3/2018 | Sun | ............... H01L 21/0337 |
| 9,941,164 B1* | 4/2018 | Kim | ............... H01L 21/76897 |
| 9,991,156 B2 | 6/2018 | Burns et al. | |
| 10,103,032 B2 | 10/2018 | deVilliers | |
| 2013/0062771 A1 | 3/2013 | Kodama et al. | |
| 2014/0273442 A1* | 9/2014 | Liu | ............... H01L 21/31144 |
| | | | 438/666 |
| 2015/0047891 A1* | 2/2015 | Lee | ............... H01L 21/76877 |
| | | | 174/250 |
| 2015/0140811 A1* | 5/2015 | Huang | ............ H01L 21/0273 |
| | | | 438/669 |

(Continued)

*Primary Examiner* — Bac H Au
(74) *Attorney, Agent, or Firm* — FINNEGAN, HENDERSON, FARABOW, GARRETT & DUNNER LLP

(57) ABSTRACT

A method of manufacturing a semiconductor device includes providing a lower structure, sequentially forming a dielectric layer and a mask layer having a first intermediate opening on the lower structure, forming a first opening extending in a first direction to at least partially overlap the first intermediate opening, in the mask layer, forming a spacer layer on a sidewall of the mask layer to be positioned in a portion of each of the first intermediate opening and the first opening, forming second openings spaced apart by the first intermediate opening in the first direction, in the mask layer, patterning the dielectric layer using the mask layer, and forming a metal material layer by filling a patterned region of the dielectric layer with a metal material.

19 Claims, 38 Drawing Sheets

(56) References Cited

U.S. PATENT DOCUMENTS

| | | | |
|---|---|---|---|
| 2015/0311086 A1* | 10/2015 | Chang | H01L 21/76816 |
| | | | 257/618 |
| 2016/0225666 A1* | 8/2016 | Bouche | H01L 21/76897 |
| 2016/0276154 A1 | 9/2016 | Huang et al. | |
| 2017/0062271 A1* | 3/2017 | Brink | H01L 21/0271 |
| 2017/0294311 A1* | 10/2017 | Huang | H01L 21/76816 |
| 2017/0365472 A1 | 12/2017 | Huang et al. | |
| 2019/0067022 A1* | 2/2019 | Lin | H01L 21/31138 |
| 2019/0157094 A1* | 5/2019 | Lin | H01L 21/76811 |
| 2022/0415713 A1* | 12/2022 | Lin | H01L 21/76895 |

\* cited by examiner

METHOD OF MANUFACTURING SEMICONDUCTOR DEVICES

CROSS-REFERENCE TO RELATED APPLICATION

This application claims the benefit under 35 USC 119(a) of Korean Patent Application No. 10-2021-0057891 filed on May 4, 2021, in the Korean Intellectual Property Office, the entire disclosure of which is incorporated herein by reference for all purposes.

BACKGROUND

1. Field

Embodiments relate to a method of manufacturing a semiconductor device.

2. Description of the Related Art

As demand for high performance, high speed, and/or multifunctionality of semiconductor devices increases, the degree of integration of the semiconductor device is increasing. The size of transistors has been reduced in accordance with the trend for high integration of semiconductor devices. Although the size of wirings electrically connected to the reduced transistors is also decreasing, it may be difficult to implement high-speed operations due to an increase in resistance of the wirings and an increase in capacitance between the wirings.

SUMMARY

Embodiments are directed to a method of manufacturing a semiconductor device, the method including: providing a lower structure; sequentially forming a dielectric layer and a mask layer having a first intermediate opening on the lower structure; forming a first opening in the mask layer, the first opening extending in a first direction to at least partially overlap the first intermediate opening; forming a spacer layer on a sidewall of the mask layer to be positioned in a portion of each of the first intermediate opening and the first opening; forming second openings in the mask layer, the second openings being spaced apart from each other by the first intermediate opening along the first direction; patterning the dielectric layer using the mask layer; and forming a metal material layer by filling a patterned region of the dielectric layer with a metal material. In the first direction, the first intermediate opening may have a first width, and the spacer layer has a second width that is less than half of the first width.

Embodiments are directed to a method of manufacturing a semiconductor device, the method including: forming a mask layer having a first intermediate opening, on a dielectric layer; forming a first opening in the mask layer, the first opening extending in a first direction to at least partially overlap the first intermediate opening and having a second width in a second direction, perpendicular to the first direction, that is equal to or less than a first width of the first intermediate opening in the first direction; forming a spacer layer in portions of the first intermediate opening and the first opening to connect the first intermediate opening and the first opening to each other; patterning the dielectric layer using the mask layer; and forming a metal material layer in a patterned region of the dielectric layer, the metal material layer including a first metal wiring extending along the first direction and an intermediate metal wiring extending from the first metal wiring in the second direction.

Embodiments are directed to a method of manufacturing a semiconductor device, the method including: forming an intermediate opening in a mask layer; forming, in the mask layer, first openings extending in a first direction, spaced apart from each other along a second direction, perpendicular to the first direction, and at least partially overlapping the intermediate opening; forming a spacer layer in the intermediate opening and the first openings, to at least partially include an empty space inside of each of the intermediate opening and the first openings; and forming second openings in the mask layer, the second openings being spaced apart from each other by the intermediate opening along the first direction. The intermediate opening may be disposed between the first openings adjacent to each other, and a width of the intermediate opening in the first direction may be greater than about twice a width of the spacer layer in the first direction.

BRIEF DESCRIPTION OF DRAWINGS

Features will become apparent to those of skill in the art by describing in detail example embodiments with reference to the attached drawings in which.

DETAILED DESCRIPTION

Figure 1:
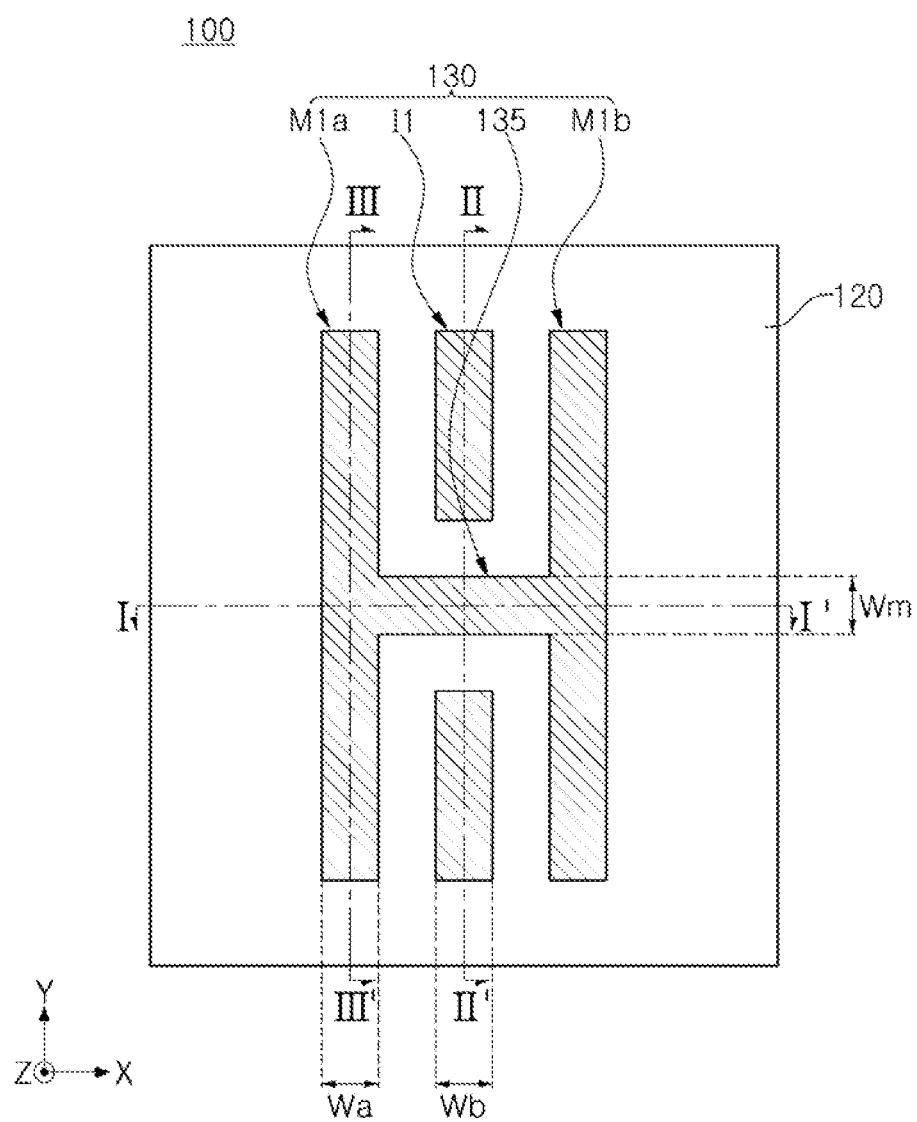
FIG. 1 is a plan view illustrating a semiconductor device according to an example embodiment.
Figure 2A:
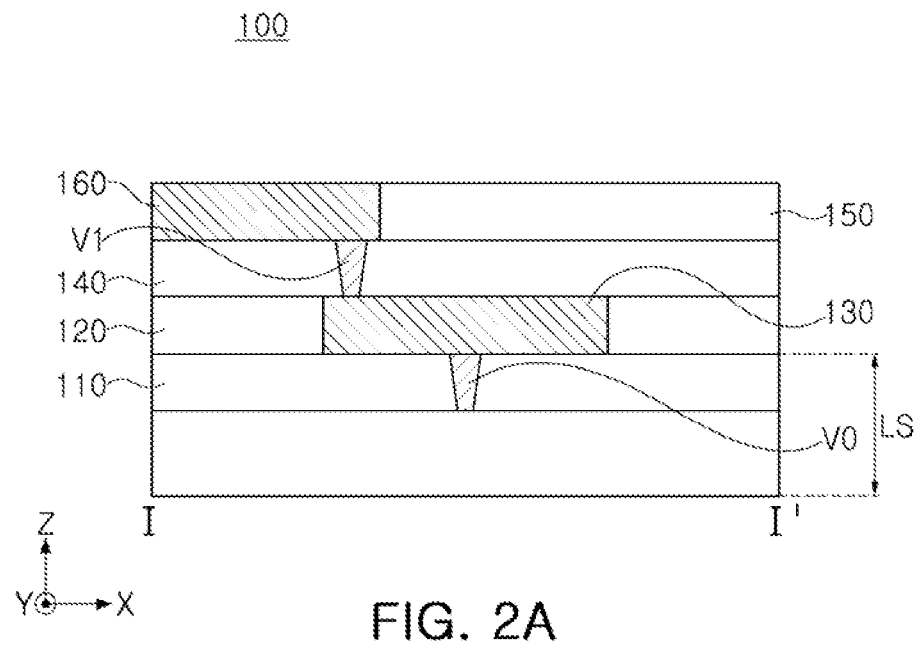
FIGS. 2A and 2B are cross-sectional views illustrating a semiconductor device according to an example embodiment.
Figure 2B:
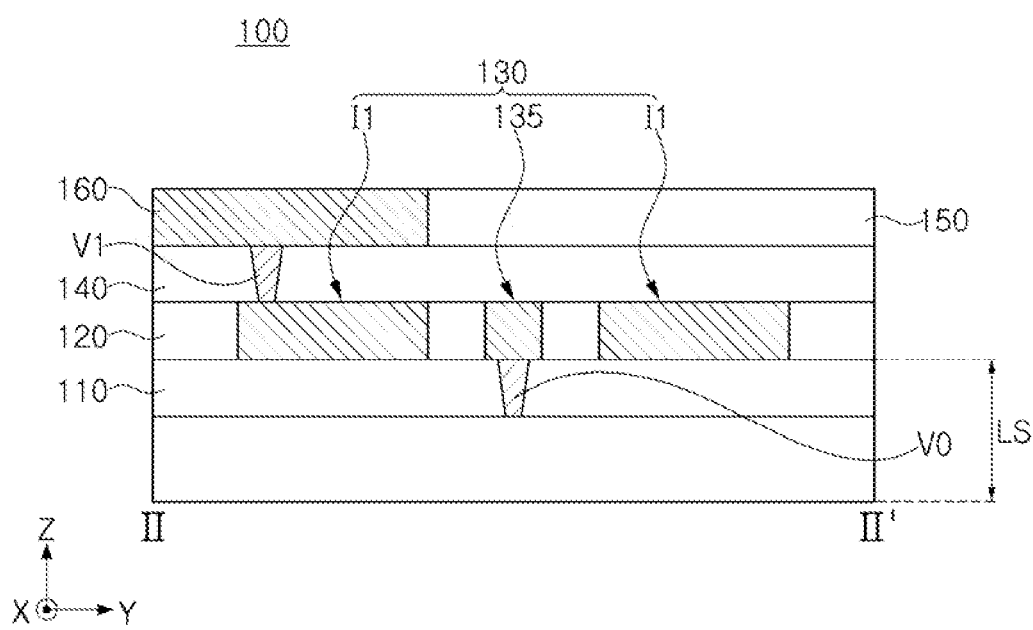

FIG. 1 is a plan view illustrating a semiconductor device according to an example embodiment. FIGS. 2A and 2B are cross-sectional views illustrating a semiconductor device according to an example embodiment. FIG. 2A illustrates a cross section taken along line I-I' of FIG. 1, and FIG. 2B illustrates a cross section taken along line II-II' of FIG. 1.

Referring to FIGS. 1 to 2B, a semiconductor device 100 may include a lower structure LS, a first metal material layer 130 on the lower structure LS, a dielectric layer 120 on the lower structure LS between respective portions of a first metal material layer 130, a first insulating layer 140 on the first metal material layer 130 and the dielectric layer 120, a second insulating layer 150 on the first insulating layer 140, a second metal material layer 160 disposed inside of the second insulating layer 150 on the first insulating layer 140, and a through-via V1 penetrating through the first insulating layer 140 and electrically connecting at least a portion of the first metal material layer 130 and at least a portion of the second metal material layer 160 to each other. FIG. 1 illustrates a plan view at the level of the first metal material layer 130.

The lower structure LS may include a lower through-via V0 penetrating through a lower insulating layer 110 and electrically connected to at least a portion of the first metal material layer 130, in an upper region thereof.

The lower structure LS may include a semiconductor substrate. The lower structure LS may include transistors constituting an integrated circuit on the semiconductor substrate. The transistors constituting the integrated circuit may include a planar Metal Oxide Semiconductor FET (MOSFET), a FinFET in which an active region has a fin structure, a gate-all-around transistor or a Multi Bridge Channel FET (MBCFET™) including a plurality of channels vertically stacked, or a vertical FET (VFET). The integrated circuit may include memory devices such as a DRAM, NAND flash, and the like.

The first metal material layer 130 may include first metal wirings M1a and M1b, an intermediate metal wiring 135 connecting between the first metal wirings M1a and M1b, and second metal wirings I1 spaced apart from each other. The first metal wirings M1a and M1b and the intermediate metal wiring 135 may be on the same plane. The first metal wirings M1a and M1b, the intermediate metal wiring 135, and the second metal wirings I1 may be on the same plane. The first metal material layer 130 may include a plurality of the first metal wirings M1a and M1b forming first metal interconnections M1a and M1b extending in the Y-direction and spaced apart from each other along the X-direction.

The intermediate metal wiring 135 may connect the first metal wirings M1a and M1b to each other, between the adjacent first metal wirings M1a and M1b. The intermediate metal wiring 135 may be disposed in an area adjacent to the center of the first metal wirings M1a and M1b in the Y-direction (as illustrated), but the arrangement relationship of the intermediate metal wiring 135 with the first metal wirings M1a and M1b on a plane may vary.

The second metal wirings I1 may be disposed to be spaced apart from each other along the Y-direction. The second metal wirings I1 may be disposed between the adjacent first metal wirings M1a and M1b.

The intermediate metal wiring 135 may extend in the X-direction from at least one of the first metal wirings M1a and M1b that extend in the Y-direction. The intermediate metal wiring 135 may have a shape protruding from the first metal wirings M1a and M1b. The intermediate metal wiring 135 may be disposed between the first metal wirings M1a and M1b. The intermediate metal wiring 135 may be disposed between the second metal wirings I1.

On the same plane, the intermediate metal wiring 135 may electrically connect between the plurality of first metal wirings M1a and M1b extending in one direction, thereby reducing the connection distance between the first metal wirings M1a and M1b. The resistance of the first metal material layer 130 may be reduced by reducing the connection distance between the first metal wirings M1a and M1b. The area occupied by the metal wiring structures in the semiconductor device 100 including the first metal material layer 130 may be reduced by reducing the connection distance between the first metal wirings M1a and M1b.

The metal wiring structures may be a structure including the first metal material layer 130, and metal material layers, e.g., second metal material layers 160, disposed at different heights in a direction (Z-direction), perpendicular to the upper surface of the lower structure LS.

A width Wa in the X-direction of each of the first metal wirings M1a and M1b and a width Wb in the X-direction of each of the second metal wirings I1 may be substantially the same. The width Wa in the X-direction of each of the first metal wirings M1a and M1b and a width Wm in the Y-direction of the intermediate metal wiring 135 may be substantially the same. The width Wb in the X-direction of each of the second metal wirings I1 and the width Wm in the Y-direction of the intermediate metal wiring 135 may be substantially the same.

Each of the first metal material layer 130, the second metal material layer 160, the lower through-via V0, and the through-via V1 may include a conductive material. The first metal material layer 130 may include a metal material, e.g., such as ruthenium (Ru), molybdenum (Mo), cobalt (Co), aluminum (Al), or copper (Cu). The second metal material layer 160 may include a metal material the same as or different from that of the first metal material layer 130.

The technical characteristics of the first metal material layer 130 may be equally applied to the second metal material layer 160, which is disposed at a different height from the first metal material layer 130.

The first metal material layer 130 may form one standard cell.

The dielectric layer 120 may be referred to as an intermetallic insulating layer. The dielectric layer 120 may include, e.g., silicon oxide, silicon nitride, a low-k insulating material, or the like.

The lower insulating layer 110, the first insulating layer 140, and the second insulating layer 150 may each include an insulating material.

Figure 3A:
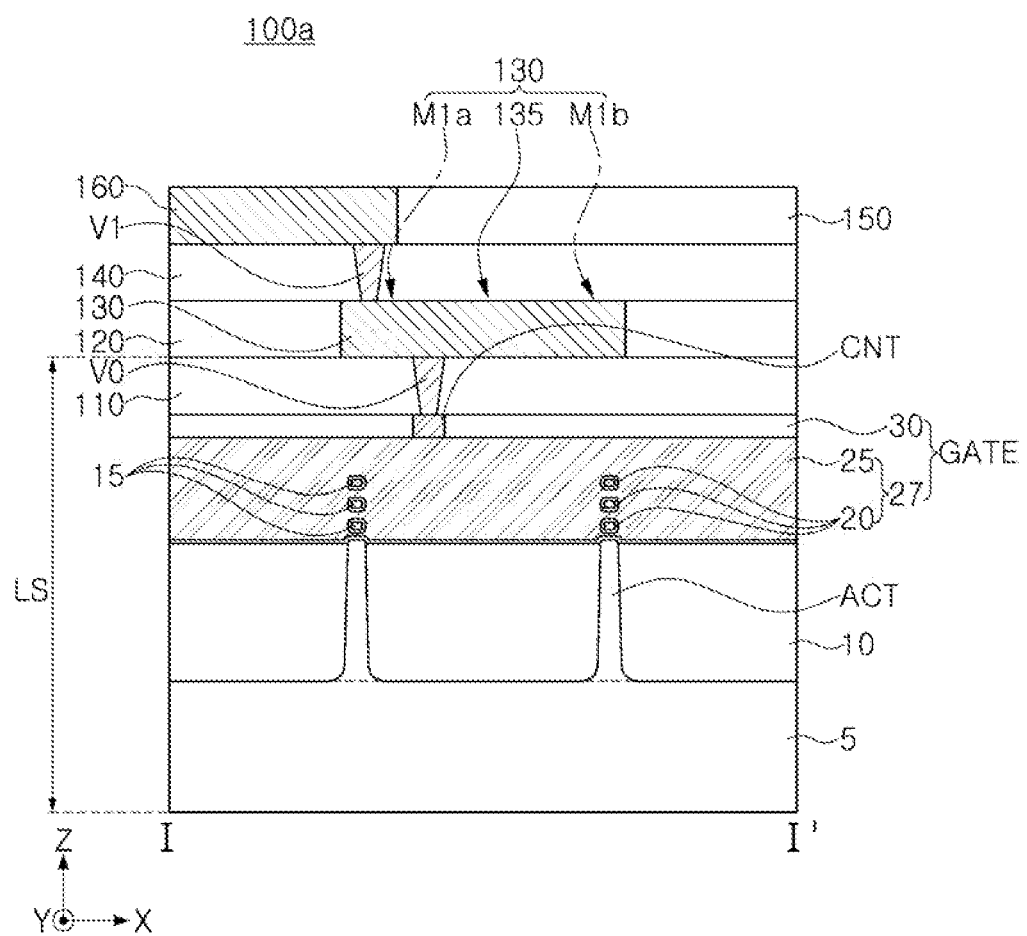
FIGS. 3A to 3C are cross-sectional views illustrating a semiconductor device according to an example embodiment.
Figure 3B:
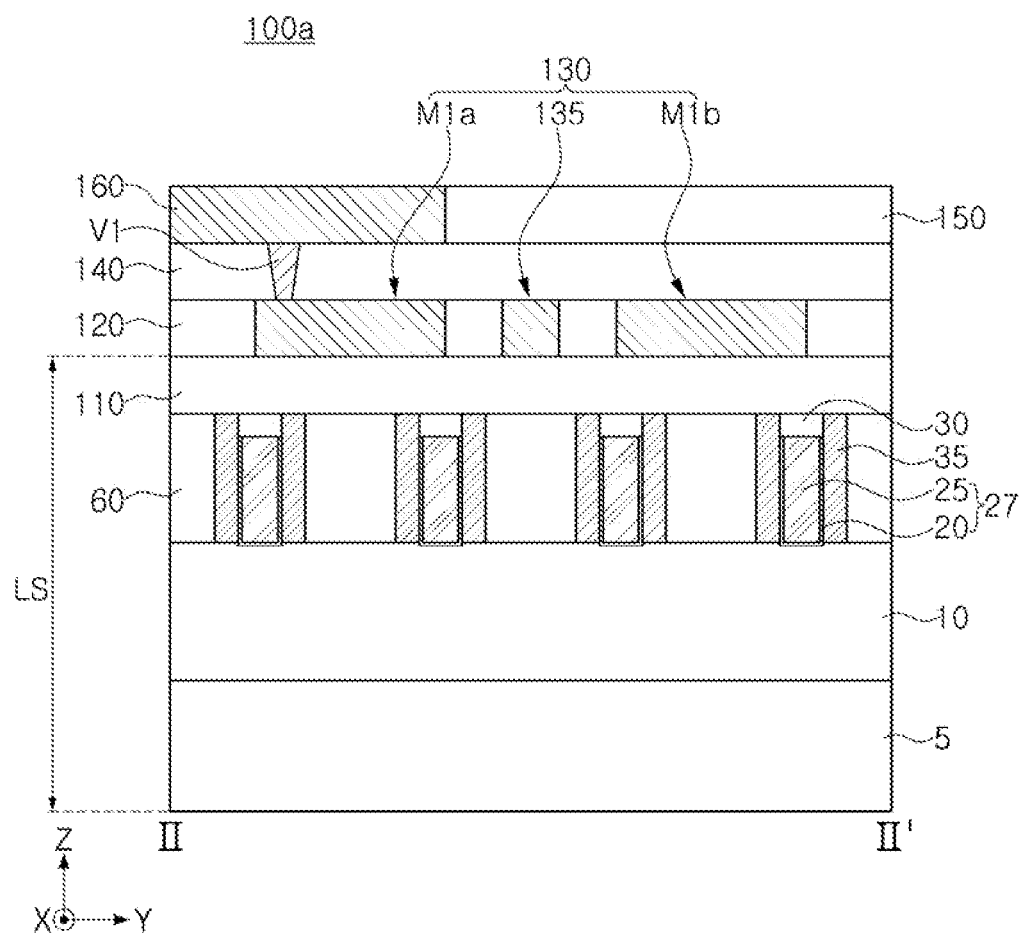
Figure 3C:
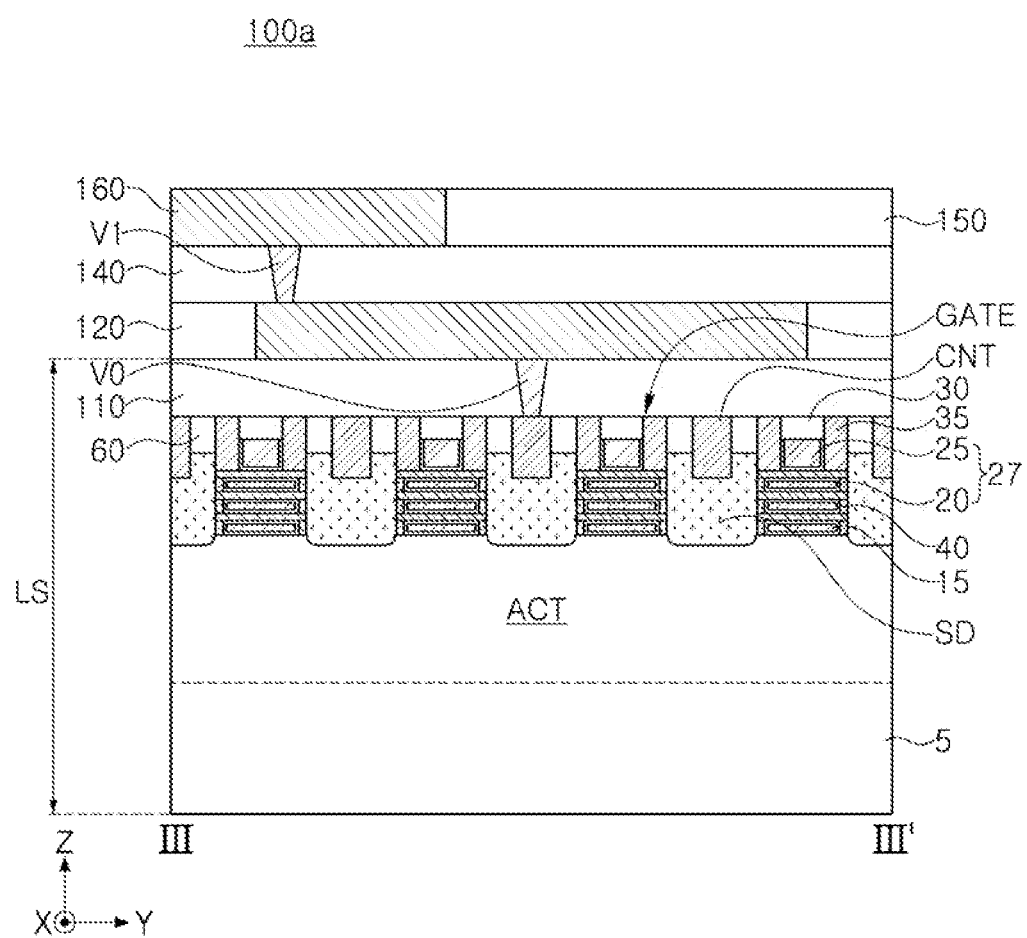

FIGS. 3A to 3C are cross-sectional views illustrating a semiconductor device according to an example embodiment. FIG. 3A illustrates a cross-section of a region corresponding to I-I' of FIG. 1, FIG. 3B illustrates a cross-section of a region corresponding to II-II' of FIG. 1, and FIG. 3C is a cross-section of a region corresponding to of FIG. 1.

Hereinafter, the same description provided with reference to FIGS. 1 to 2B may be omitted.

Referring to FIGS. 3A to 3C, a lower structure LS of a semiconductor device 100a according to the present example embodiment includes a semiconductor substrate 5, an active region ACT on the semiconductor substrate 5, a device isolation layer 10, a source/drain region SD, a gate structure GATE, a plurality of channel layers 15, and a contact plug CNT.

The semiconductor substrate 5 may include a semiconductor material, e.g., a group IV semiconductor, a group III-V compound semiconductor, or a group II-VI compound semiconductor. The group IV semiconductor may include, e.g., silicon (Si), germanium (Ge), or silicon germanium (SiGe).

The active region ACT is defined by the device isolation layer 10 in the semiconductor substrate 5 and may be disposed to extend in a first direction, e.g., a Y-direction. The active region ACT may have a structure protruding from the semiconductor substrate 5. The upper end of the active region ACT may be disposed to protrude by a predetermined height from the upper surface of the device isolation layer 10. The active region ACT may be formed of a portion of the semiconductor substrate 5, or may include an epitaxial layer grown from the semiconductor substrate 5.

On both sides of the gate structure GATE, the active region ACT on the semiconductor substrate 5 may be partially recessed, and source/drain regions SD may be on the recessed active region ACT. The active region ACT may include impurities, and at least some of the active regions ACT may include impurities of different conductivity types. The active region ACT may be provided as a plurality of active regions ACT that are disposed to be spaced apart from each other along the X-direction.

The device isolation layer 10 may define the active regions ACT on the semiconductor substrate 5. The device isolation layer 10 may be formed of an insulating material such as silicon oxide.

An interlayer insulating layer 60 covering the source/drain regions SD may be on the device isolation layer 10.

At both sides of the gate structure GATE, the source/drain regions SD may be on the active region ACT. The source/drain regions SD may serve as a source region or a drain region of the transistor. The source/drain region SD may be formed by partially recessing an upper portion of the active region ACT, but the presence or absence of a recess and a recess depth may be variously changed. The source/drain regions SD may be a semiconductor layer including silicon (Si), and may be formed of an epitaxial layer. The source/drain regions SD may include impurities of different types and/or concentrations. For example, the source/drain regions SD may include n-type doped silicon (Si) and/or p-type doped silicon germanium (SiGe). The source/drain regions SD may include a plurality of regions including different concentrations of an element and/or a doping element.

The gate structure GATE may be on the active region ACT and the plurality of channel layers 15, and may be arranged to intersect the active region ACT and the plurality of channel layers 15 and to extend in one direction, e.g., the X-direction.

Channel regions of transistors may be formed in the active region ACT and the plurality of channel layers 15, intersecting the gate structure GATE.

The gate structure GATE may include a gate 27 and an insulating capping layer 30 on the gate 27. The gate 27 may include a gate dielectric 20 and a gate electrode 25 on the gate dielectric 20.

The gate electrode 25 may be on the active region ACT to fill between the plurality of channel layers 15 and may extend upwardly of the plurality of channel layers 15. The gate electrode 25 may be spaced apart from the plurality of channel layers 15 by the gate dielectric 20. The gate electrode 25 may include a conductive material, e.g., a metal nitride such as titanium nitride (TiN), tantalum nitride (TaN), or tungsten nitride (WN), and/or a metal material such as aluminum (Al), tungsten (W) or molybdenum (Mo), or a semiconductor material such as doped polysilicon.

The plurality of channel layers 15 may be stacked on the active regions ACT in a vertical direction, perpendicular to the upper surface of the semiconductor substrate 5, and may be spaced apart from each other. The gates 27 may overlap the plurality of channel layers 15 and may cover upper and lower surfaces of the plurality of channel layers 15. The plurality of channel layers 15 may be spaced apart from the upper surface of the active region ACT while being connected to the source/drain region SD. The plurality of channel layers 15 may have the same or similar width in the X-direction as the active region ACT, and may have the same or similar width in the Y-direction as the gate structure GATE. The plurality of channel layers 15 may be formed of a semiconductor material, and may include, e.g., at least one of silicon (Si), silicon germanium (SiGe), and germanium (Ge).

Insulating gate spacers 35 may be on the plurality of channel layers 15 to cover side surfaces of the gate 27 and the insulating capping layer 30.

Insulating inner spacers 40 may be disposed between the source/drain regions SD and the gate 27.

Some of the contact plugs CNT may be electrically connected to the source/drain regions SD while being in contact therewith, on the source/drain regions SD, and others of the contact plugs CNT may be electrically connected to the gate electrode 25 while being in contact therewith, on the gate electrode 25.

Figure 4:
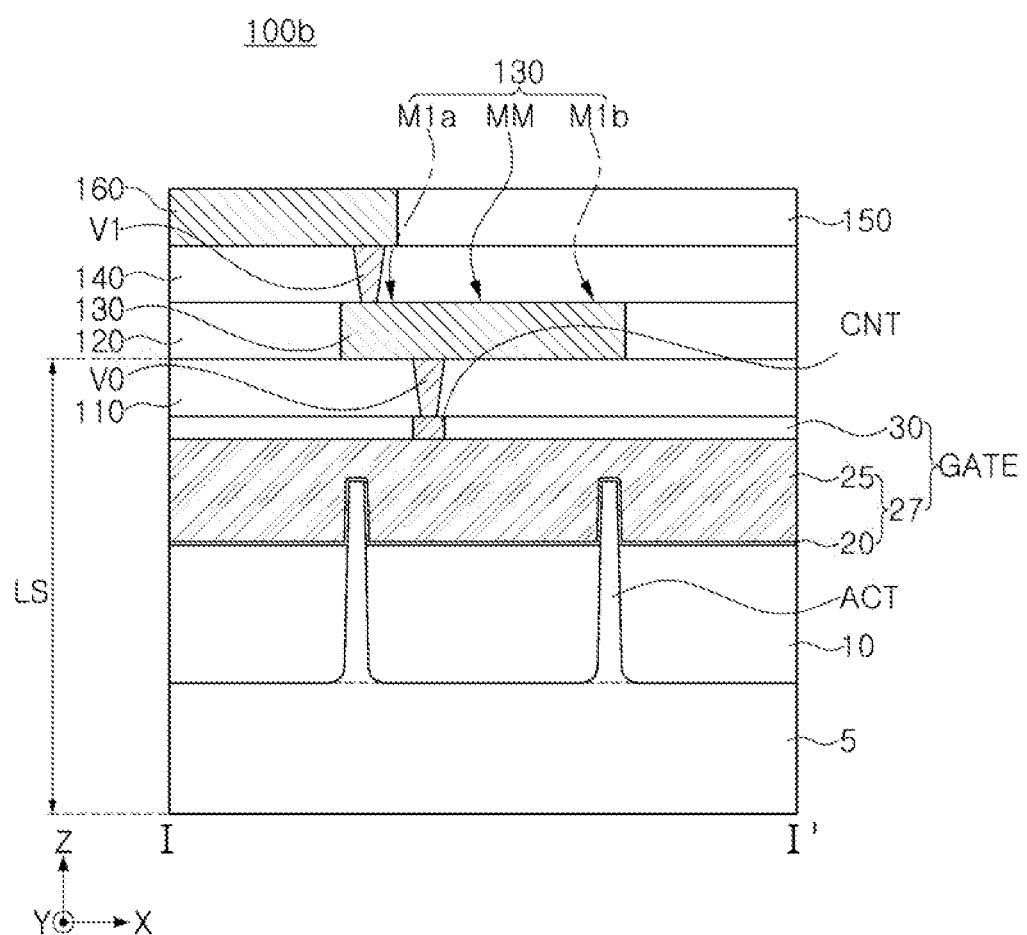
FIGS. 4 to 9 are plan views illustrating semiconductor devices according to an example embodiment.

FIG. 4 illustrates a semiconductor device according to an example embodiment. FIG. 4 is a cross-sectional view of a region corresponding to I-I' of FIG. 1.

Referring to FIG. 4, a semiconductor device 100b may include a FinFET in which a gate structure GATE surrounds three surfaces of the active region ACT, e.g., an upper surface of the active region ACT and side surfaces in the X-direction. Different from the example embodiment of FIG. 3, the semiconductor device 100b may not include a plurality of channel layers, and a channel region of the transistor may be formed in the active region ACT intersecting the gate electrode 25.

Figure 5:
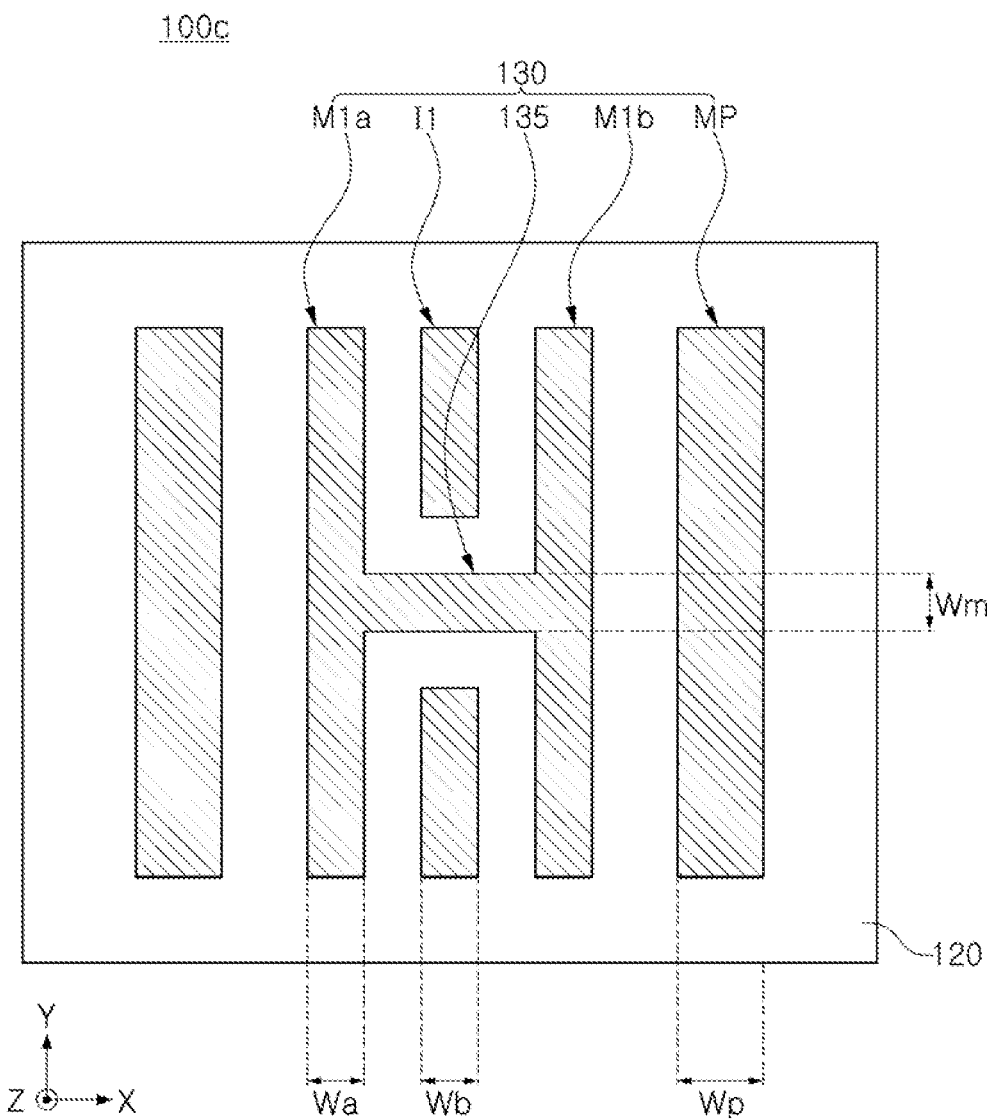

FIG. 5 is a plan view illustrating a semiconductor device according to an example embodiment.

Referring to FIG. 5, in a semiconductor device 100c, a first metal material layer 130 includes first metal wirings M1a and M1b, an intermediate metal wiring 135 connecting between the first metal wirings M1a and M1b, second metal wirings I1 spaced apart from each other, and power wirings MP.

The power wirings MP may have a width Wp greater than a width Wa of the first metal wirings M1a and M1b and a width Wb of the second metal wirings I1. The power wirings MP may have a width Wp greater than a width Wm of the intermediate metal wiring 135.

The semiconductor device 100b according to the present example embodiment may be formed similarly to a semiconductor device manufacturing method described with reference to FIGS. 10A to 17C. In operation of forming first openings OP1 described with reference to FIGS. 11A to 11C, the power wirings MP may be formed by further forming a third opening having a width greater than that of the first openings OP1 in a region corresponding to the power wirings MP. The third opening may be formed to be spaced apart from the first openings OP1 along the X-direction.

Figure 6:
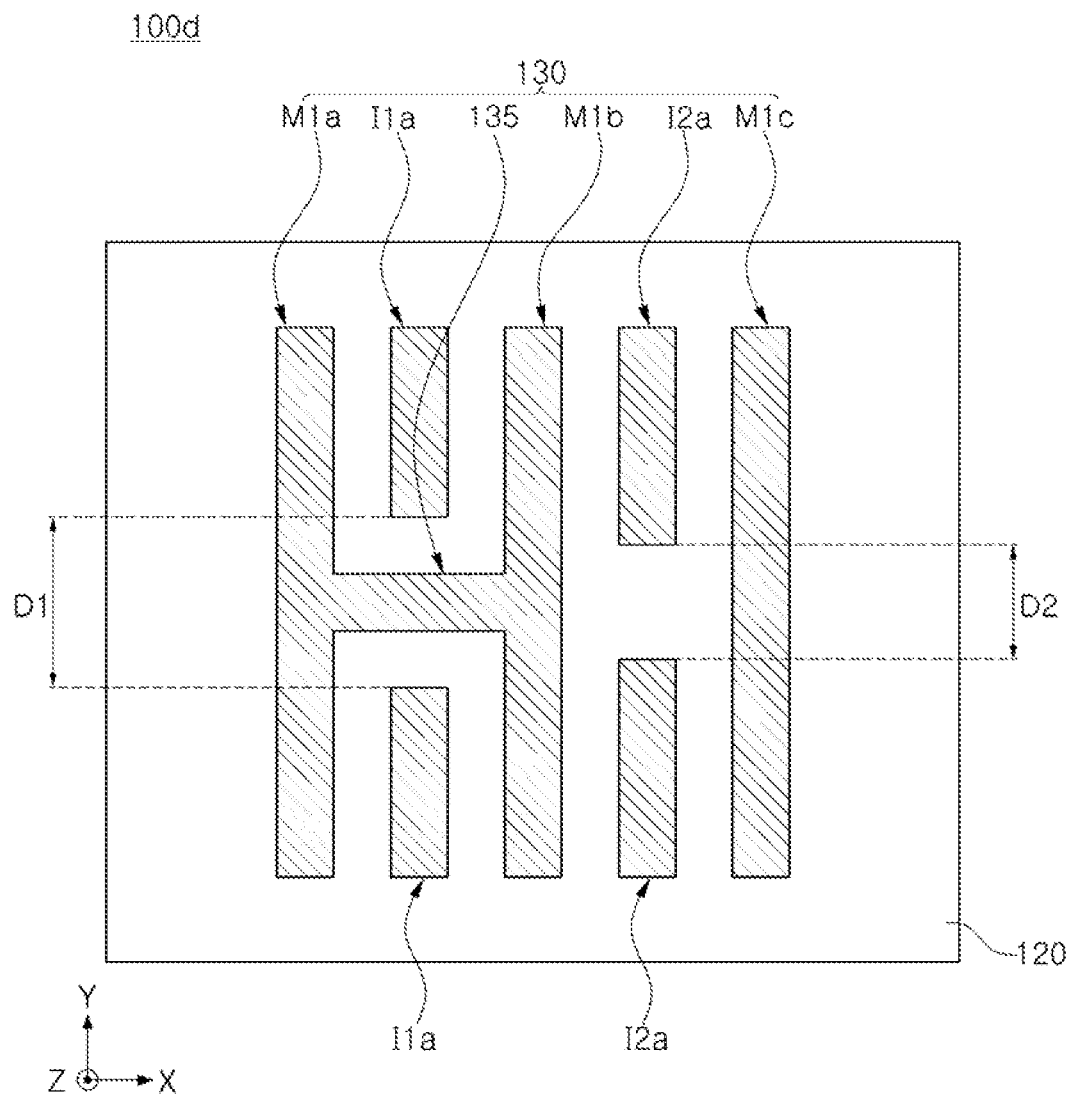

FIG. 6 is a plan view illustrating a semiconductor device according to an example embodiment.

Referring to FIG. 6, in a semiconductor device 100d, a first metal material layer 130 may include first metal wirings M1a, M1b and M1c, an intermediate metal wiring 135 connecting between the first metal wirings M1a and M1b adjacent to each other, second metal wirings I1a disposed to be spaced apart from each other, and third metal wirings I2a spaced apart from each other.

The intermediate metal wiring 135 may be disposed between the second metal wirings I1a, and the intermediate metal wiring 135 may not be disposed between the third metal wirings I2a. The third metal wirings I2a may be separated by the dielectric layer 120 in the Y-direction. Only the dielectric layer 120 may be disposed between the third metal wirings I2a. The third metal wirings I2a may be disposed between adjacent first metal wirings M1b and M1c. The third metal wirings I2a may be disposed to be spaced apart from each other along the Y-direction.

A distance D1 between adjacent second metal wirings I1a may be greater than a distance D2 between adjacent third metal wirings I2a.

Figure 7:
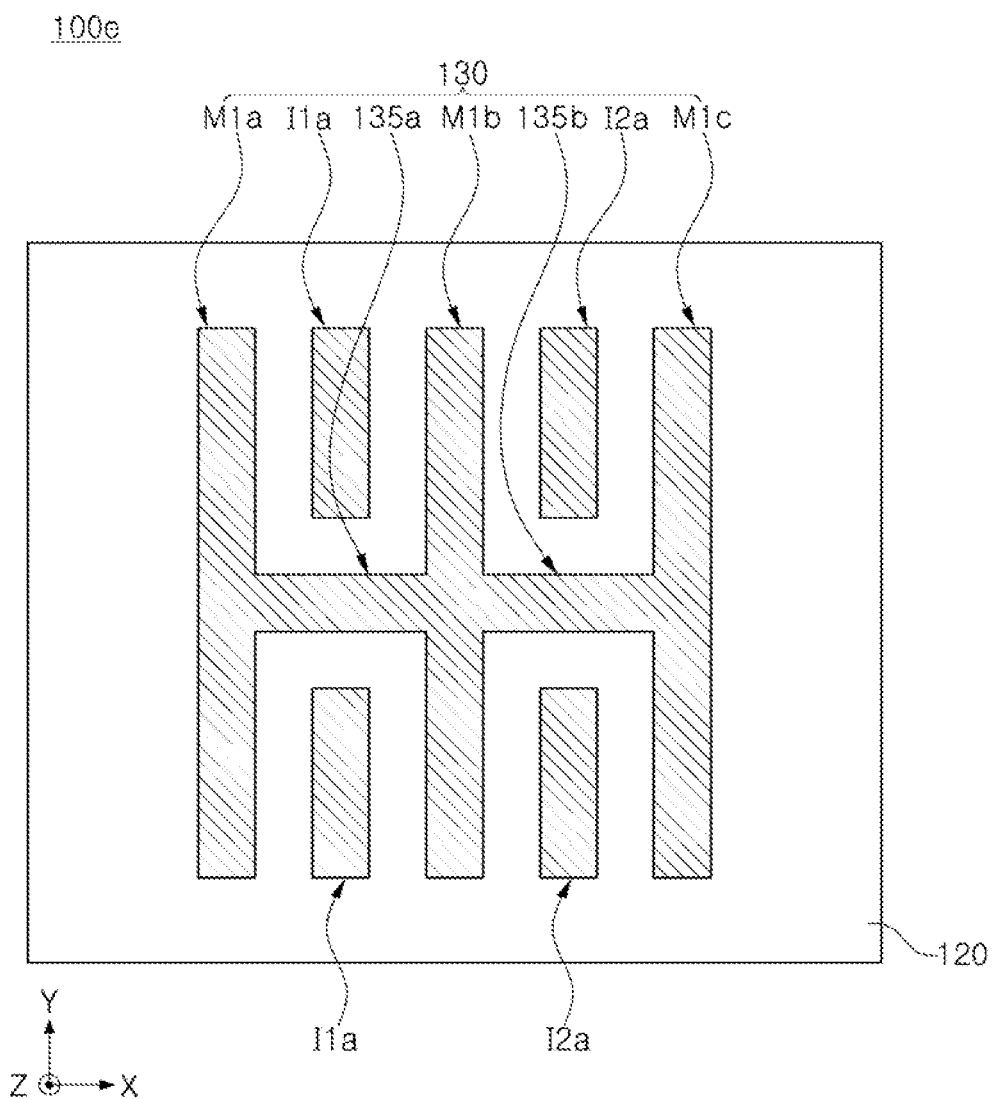

FIG. 7 is a plan view illustrating a semiconductor device according to an example embodiment.

Referring to FIG. 7, in a semiconductor device 100e, a first metal material layer 130 may include first metal wirings M1a, M1b and M1c, intermediate metal wirings 135a and 135b respectively connecting the first metal wirings M1a, M1b, and M1c adjacent to each other, and second metal wirings I1a and I1b disposed to be spaced apart from each other.

The first metal material layer 130, which is on a same plane, may include three or more first metal wirings M1a, M1b and M1c, and a plurality of intermediate metal wirings 135a and 135b that connect the different first metal wirings M1a, M1b and M1c, respectively. The intermediate metal wirings 135a and 135b are illustrated as being positioned at the same level in the Y-direction, but the arrangement of the first metal wirings M1a, M1b, and M1c and the intermediate metal wirings 135a and 135b may be changed. For example, the intermediate metal wirings 135a and 135b may be shifted from each other, rather than aligned to be disposed at the same level in the X-direction.

Figure 8:
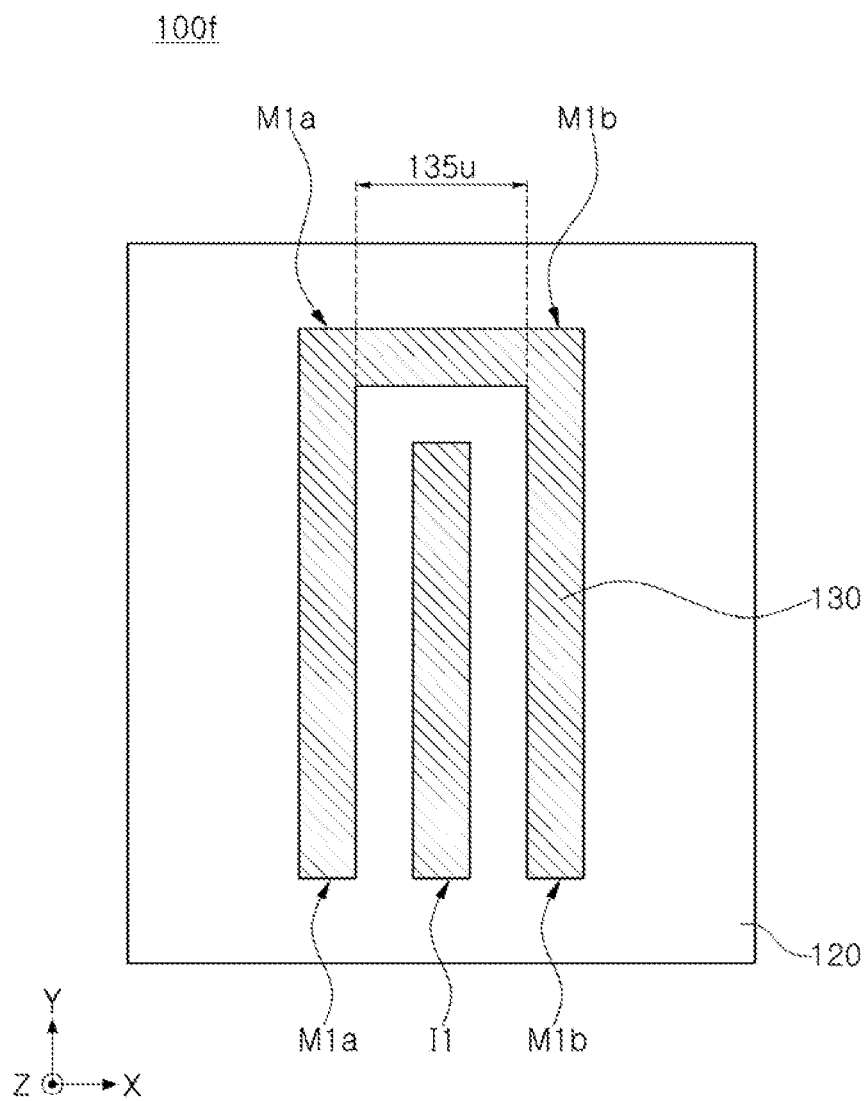

FIG. 8 is a plan view illustrating a semiconductor device according to an example embodiment.

Referring to FIG. 8, in a semiconductor device 100f, a first metal material layer 130 may include first metal wirings M1a and M1b, an intermediate metal wiring 135u connecting between the first metal wirings M1a and M1b adjacent to each other, and a second metal wiring I1 disposed between the first metal wirings M1a and M1b.

The intermediate metal wiring 135u may be disposed between upper regions of each of the first metal wirings M1a and M1b. The intermediate metal wiring 135u may be disposed to contact an upper end of each of the first metal wirings M1a and M1b adjacent to each other. The first metal wirings M1a and M1b and the intermediate metal wiring 135u may form a '⊏' shape or a C shape.

As described below with reference to FIGS. 14A to 14C, the shape of the first metal material layer 130 may be formed by adjusting the position of formation of the first opening OP1 such that an upper end of each of the first openings OP1 overlaps an intermediate opening OPM in the forming operation of the first openings OP1 described with reference to FIGS. 14A to 14C.

Figure 9:
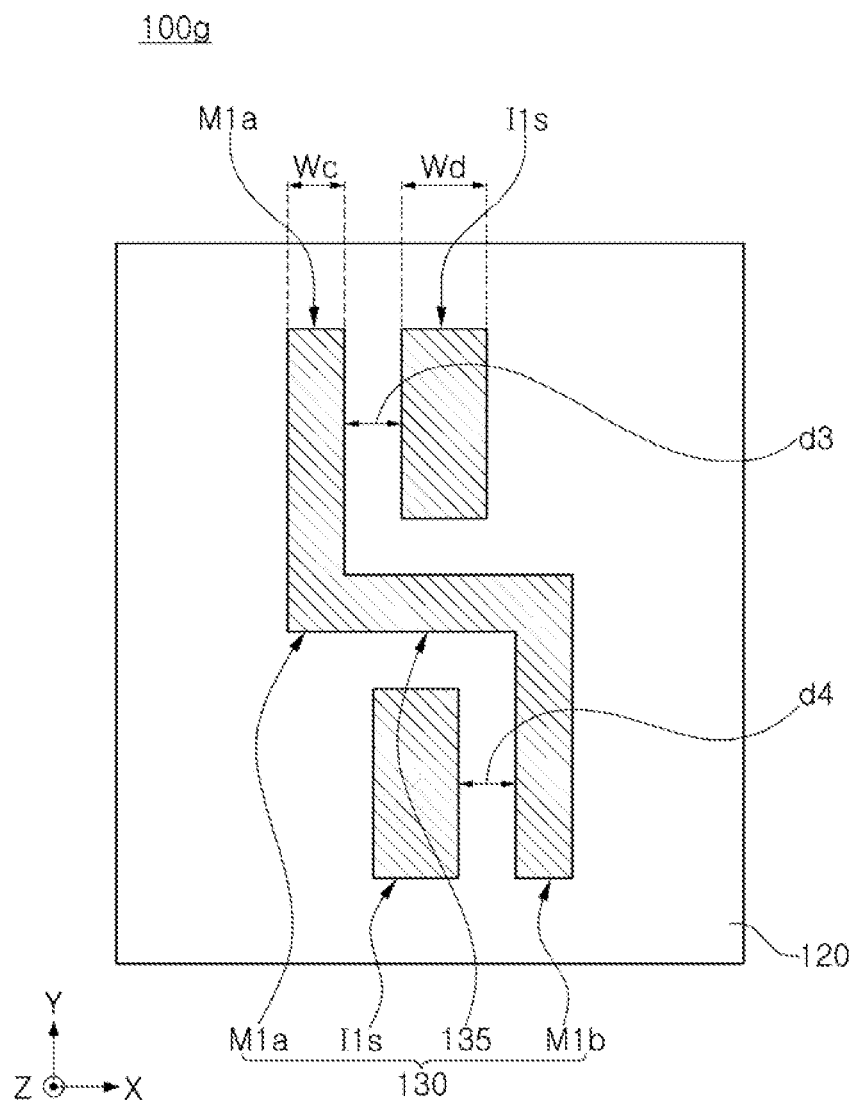

FIG. 9 is a plan view illustrating a semiconductor device according to an example embodiment.

Referring to FIG. 9, in a semiconductor device 100g, a first metal material layer 130 may include first metal wirings M1a and M1b, an intermediate metal wiring 135 connecting between the first metal wirings M1a and M1b adjacent to each other, and second metal wirings I1s disposed between the first metal wirings M1a and M1b.

Upper ends of the first metal wirings M1a and M1b may be disposed at different levels in the Y-direction. The first metal wirings M1a and M1b may be disposed to include regions that do not overlap each other in the X-direction.

The intermediate metal wiring 135 may not be disposed to contact the central region of each of the first metal wirings M1a and M1b, but instead the intermediate metal wiring 135 may contact a lower portion of the one first metal wiring M1a among the pair of adjacent first metal wirings M1a and M1b, and may contact an upper portion of the other first metal wiring M1b.

The first metal wirings M1a and M1b and the intermediate metal wiring 135 may form, e.g., a '⊏' shape or an 'S' shape.

The second metal wirings I1s may have a width greater than a width Wc of each of the first metal wirings M1a and M1b. A width Wd of the second metal wirings I1s may be, e.g., within a range from about 1.2 times to about 1.7 times the width Wc of the first metal wirings M1a and M1b. In the operation of forming second openings OP2c and OP2d described with reference to FIG. 21C, as a region in which first openings OP1d and OP1e do not overlap each other in the X-direction is present, the second openings OP2c and OP2d may be formed to be relatively wider, and thus, the width of the second metal wirings I1s may be relatively large.

The second metal wirings I1s may not be aligned in a line in the Y-direction, and may have a shifted arrangement in the X-direction. Distances d3 and d4 of the second metal wirings I1s to the closest first metal wirings M1a and M1b, respectively, may be substantially the same.

FIGS. 10A to 17C are diagrams, in process order, of a method of manufacturing the semiconductor device of FIG. 1 according to an example embodiment. Among FIGS. 10A to 17C, the views illustrated in FIGS. 12A, 13A, 14A, 15A, 16A, 17A, 18A and 19A are plan views of stages in the method, FIGS. 12B, 13B, 14B, 15B, 16B and 17B are cross sections taken along line IV-IV' in FIGS. 12A, 13A, 14A, 15A, 16A, and 17A, respectively, and FIGS. 12C, 13C, 14C, 15C, 16C and 17C are cross-sections taken along line V-V' of FIGS. 12A, 13A, 14A, 15A, 16A, and 17A, respectively. Additional reference is made to FIG. 18, which is a flowchart of a method of manufacturing a semiconductor device according to an example embodiment, and FIG. 19 which is another flowchart of a method of manufacturing a semiconductor device according to an example embodiment.

Figure 10A:
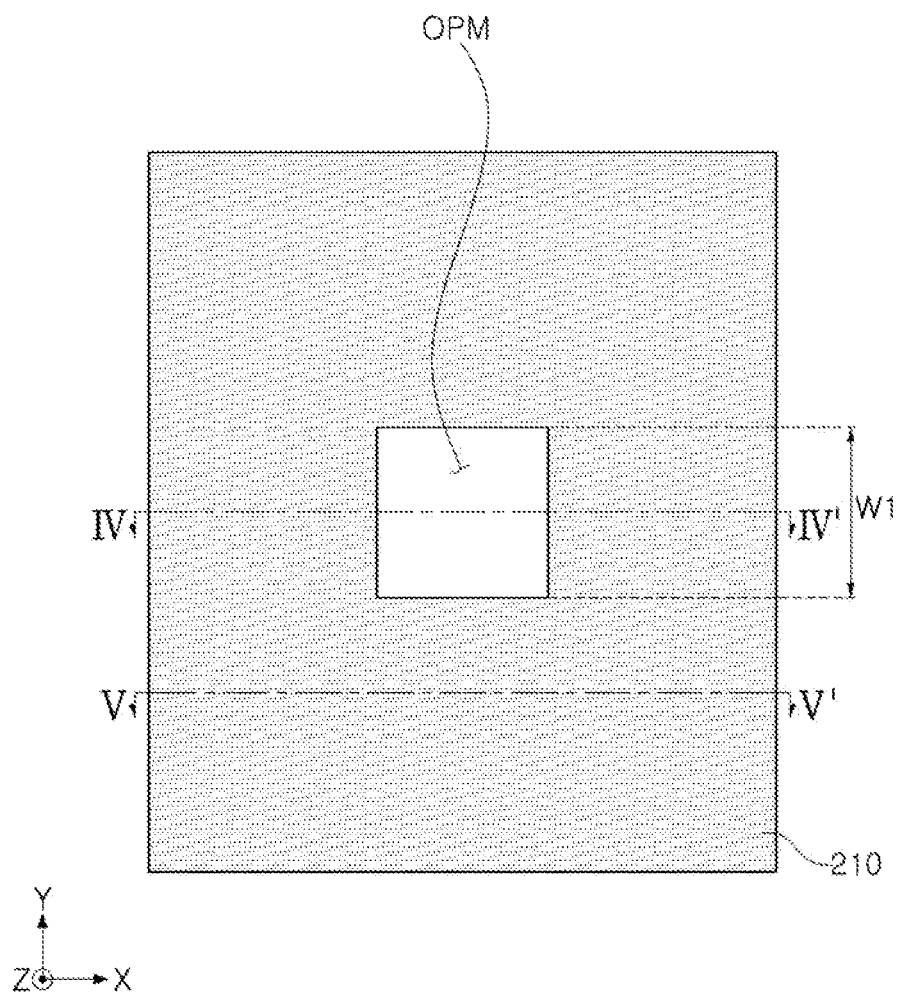
FIGS. 10A to 17C are diagrams illustrating a process sequence to illustrate a method of manufacturing a semiconductor device according to an example embodiment.
Figure 10B:
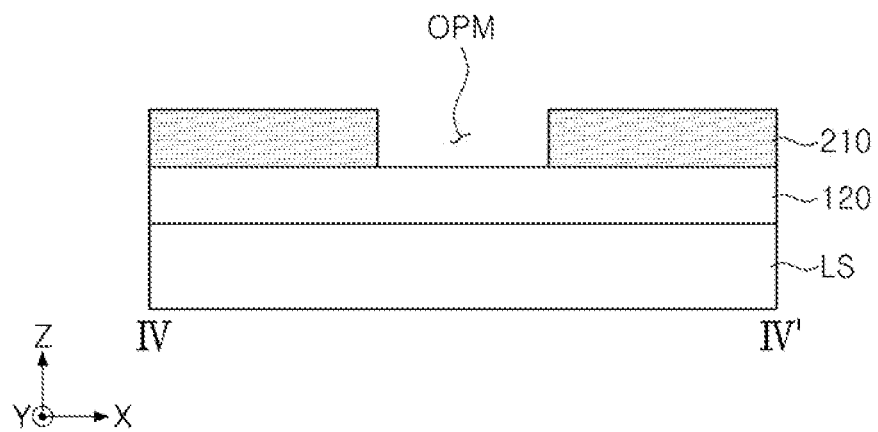
Figure 10C:
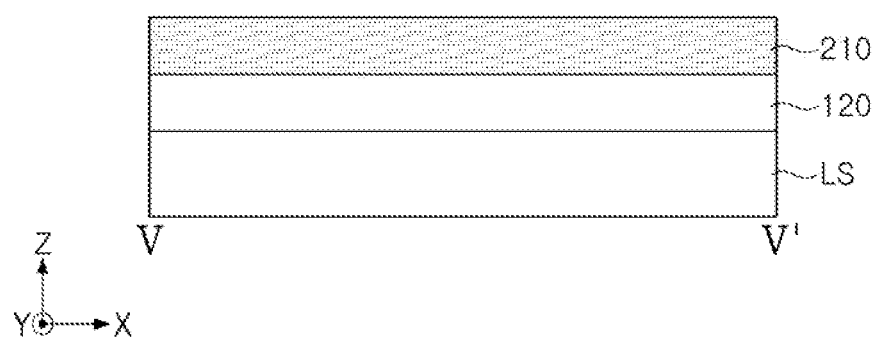
Figure 18:
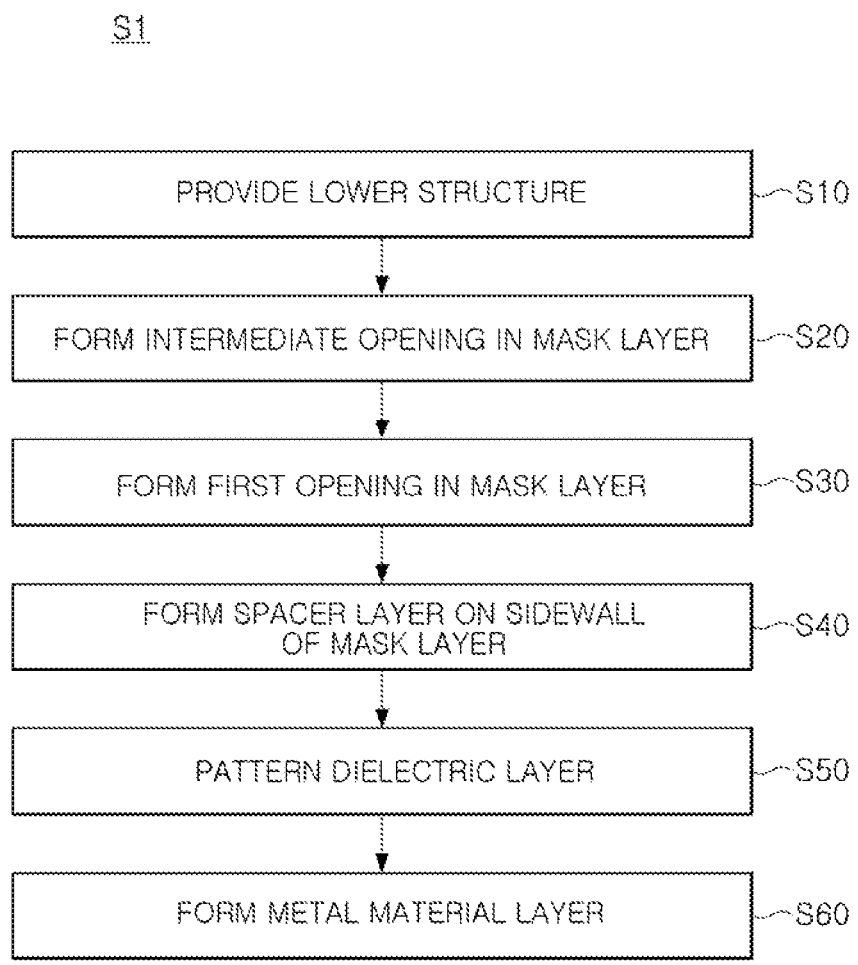
FIG. 18 is a flowchart of a method of manufacturing a semiconductor device according to an example embodiment.
Figure 19:
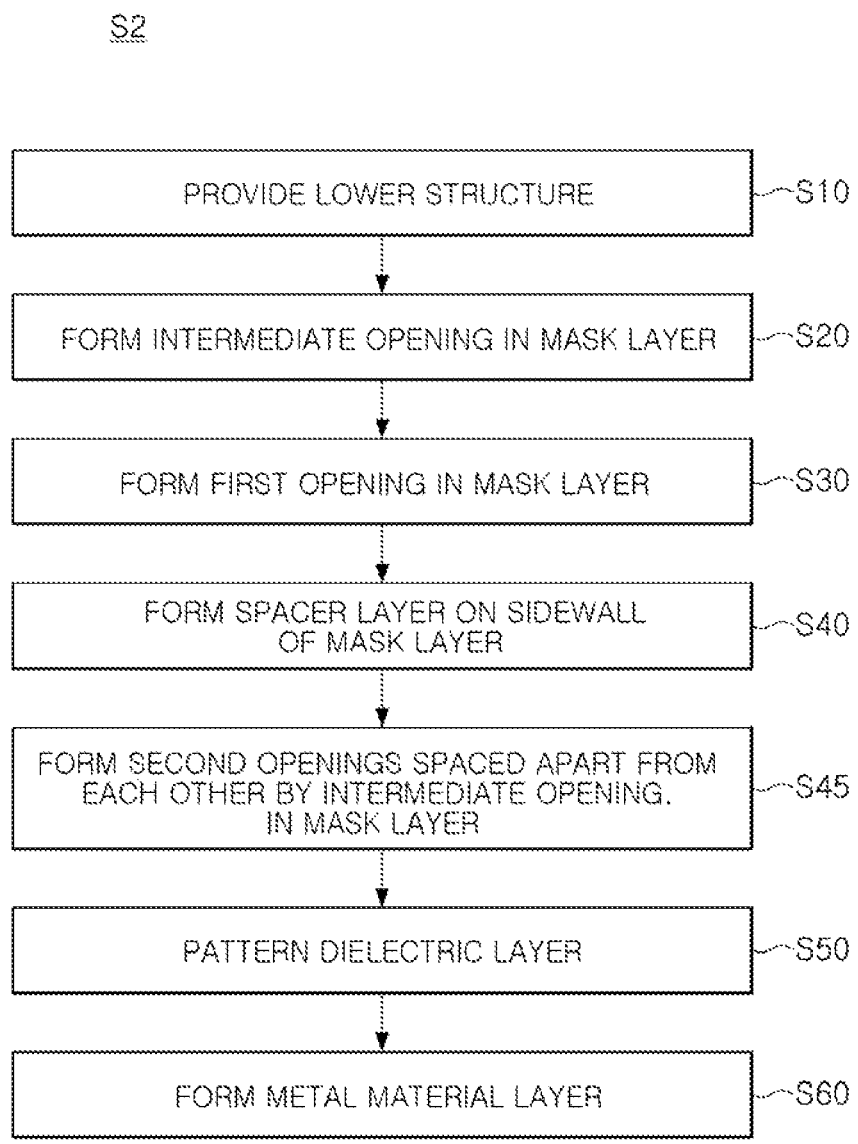
FIG. 19 is a flowchart of a method of manufacturing a semiconductor device according to an example embodiment.

FIGS. 10A to 10C illustrate an operation of providing a lower structure (refer to operation S10 in FIGS. 18 and 19) and an operation of forming an intermediate opening in the mask layer on a dielectric layer (refer to operation S20 in FIGS. 18 and 19).

First, the lower structure LS including the semiconductor substrate may be provided. The lower structure LS may include transistors constituting an integrated circuit on a semiconductor substrate.

Next, the dielectric layer 120 may be formed on the lower structure LS. The dielectric layer 120 may include, e.g., silicon oxide, silicon nitride, or a low-k insulating material having a dielectric constant lower than that of silicon oxide.

Next, a lower mask layer 210 may be formed on the dielectric layer 120. The lower mask layer 210 is illustrated as one layer, but may be formed of a plurality of layers. The lower mask layer 210 may include a material having an etch selectivity to the dielectric layer 120.

Next, an intermediate opening OPM may be formed in the lower mask layer 210, e.g., through a photoresist process and an etching process.

The intermediate opening OPM may be formed in a region corresponding to the region in which the intermediate metal wiring 135 of the metal material layer 130 (described with reference to FIGS. 1 to 2B) will be disposed.

The intermediate opening OPM may be formed to have a width W1 in the Y-direction that is equal to or greater than a width W2 in the X-direction of a first opening OP1 (the width W2 is described below referring to FIG. 12A).

The intermediate opening OPM may have a width that is greater than about twice a width t of a spacer layer 215 (refer to FIG. 13A, described below) in the Y-direction. The width W1 in the Y-direction of the intermediate opening OPM may be, e.g., about 2.5 times to about 4 times the width of the spacer layer 215 (described below). The width W1 in the Y-direction of the intermediate opening OPM may be, e.g., about 3 to about 4 times the width of the spacer layer 215 (described below). For example, the intermediate opening OPM may be formed to have the width W1 that is sufficient to include an empty space in the intermediate opening OPM after an operation (refer to operation S40 in FIG. 18) of forming the spacer layer 215 (refer to FIG. 13A, described below).

Figure 11A:
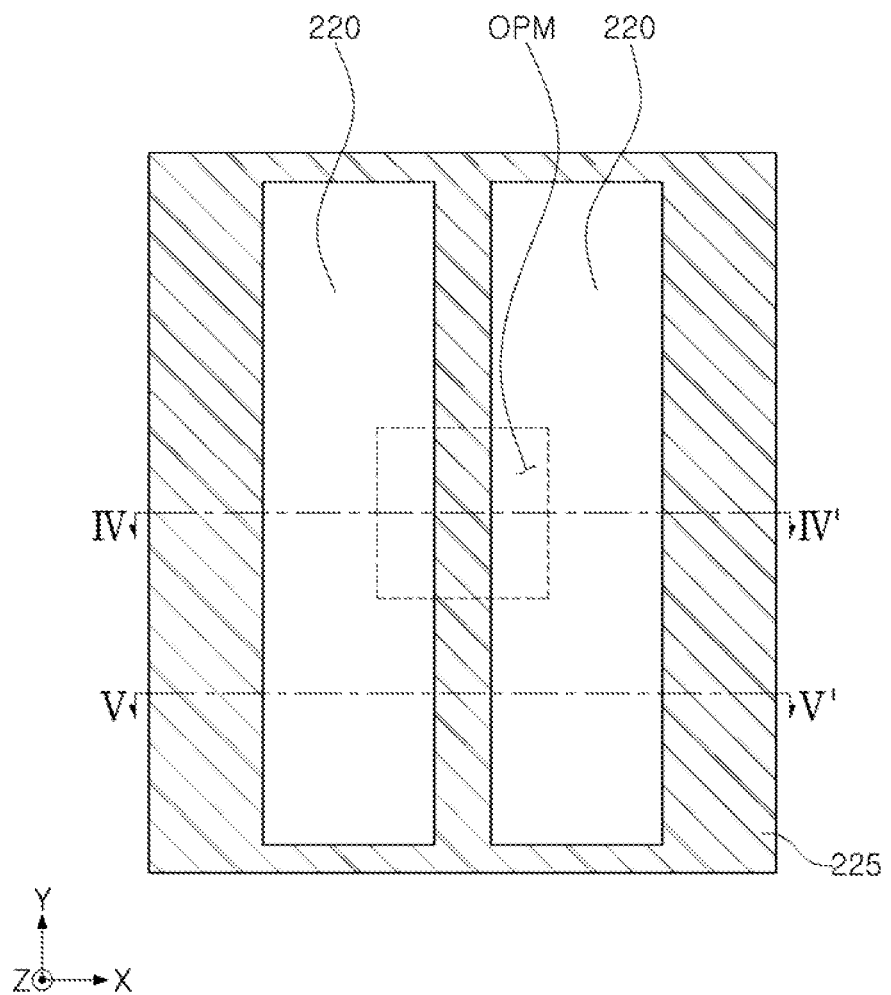
Figure 11B:
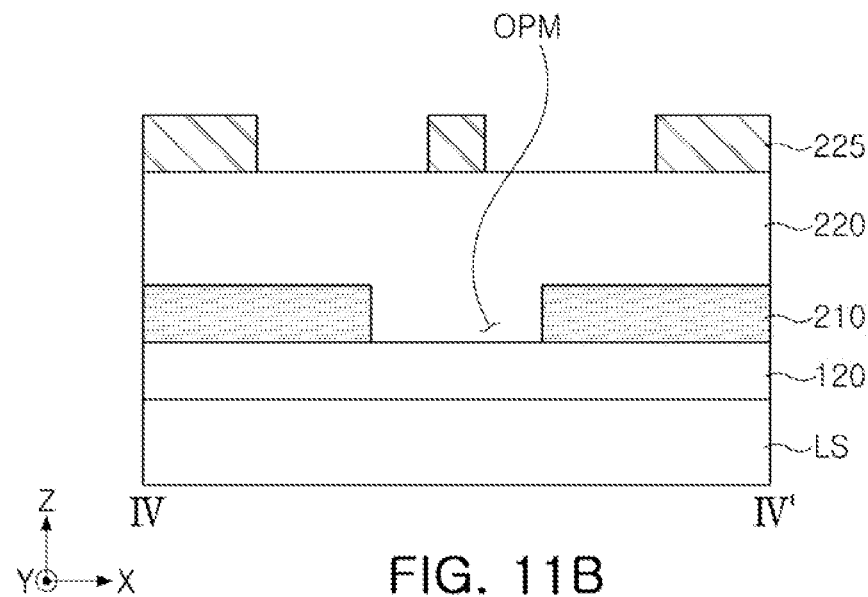
Figure 11C:
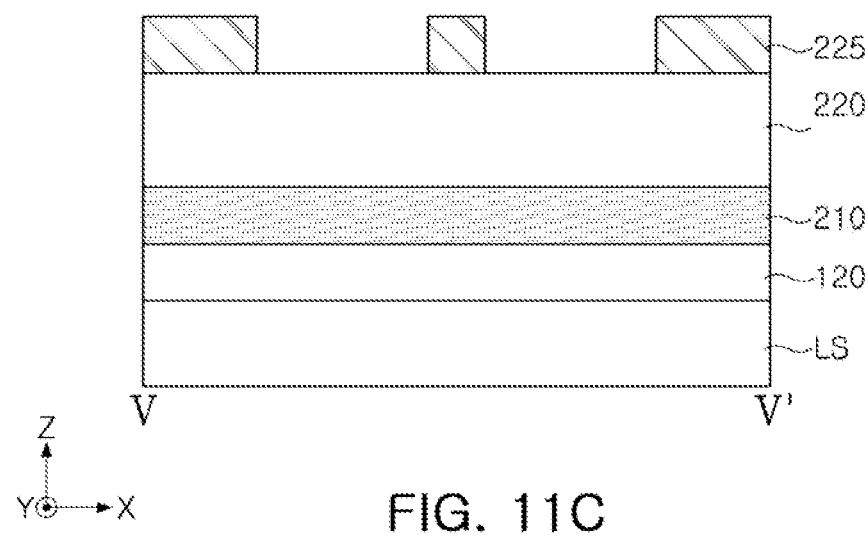

FIGS. 11A to 11C illustrate an operation of forming a first upper mask layer for forming the first opening OP1 (refer to FIGS. 12A to 12C, below).

A first upper mask layer 220 may be formed on the lower mask layer 210 having the intermediate opening OPM. The first upper mask layer 220 is illustrated as a single layer, but may be formed of a plurality of layers.

Next, a first photosensitive insulating pattern layer 225 may be formed on the first upper mask layer 220. The first photosensitive insulating pattern layer 225 may include openings to correspond to positions in which first openings OP1 are formed (refer to FIGS. 12A to 12C, below).

The first upper mask layer 220 may be etched by using the first photosensitive insulating pattern layer 225 as a mask pattern.

Figure 12A:
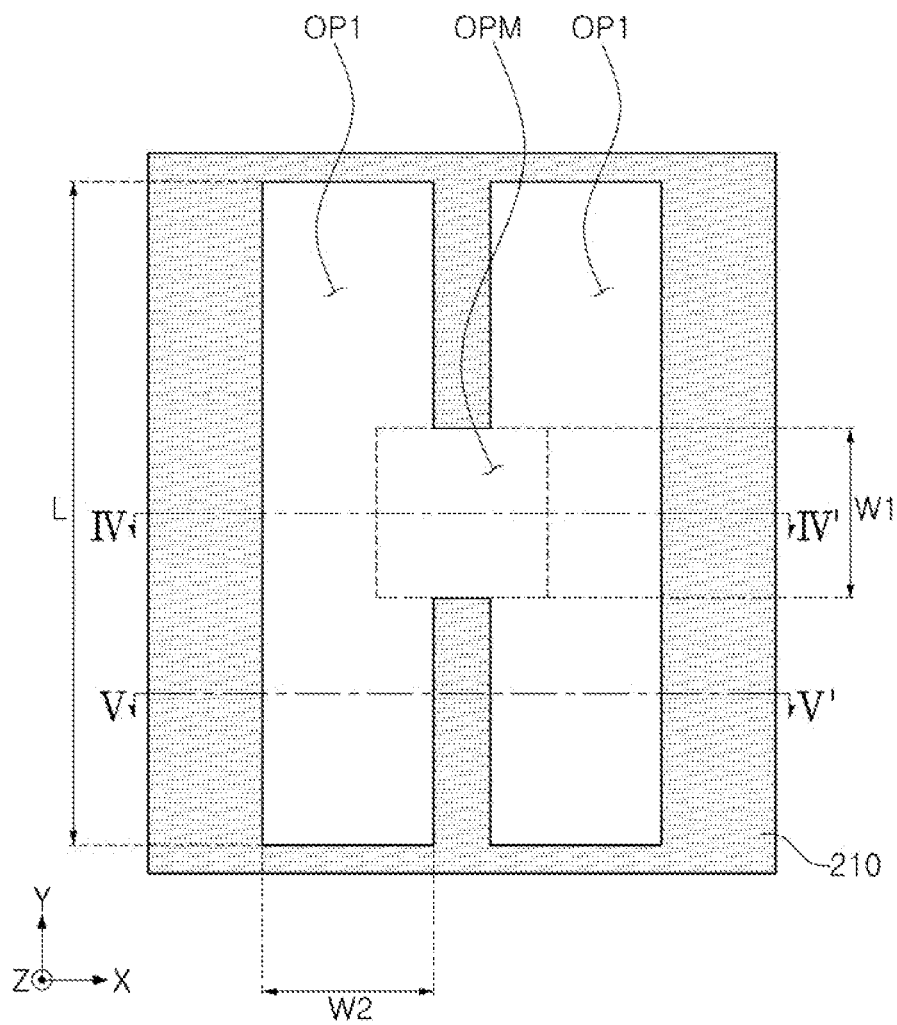
Figure 12B:
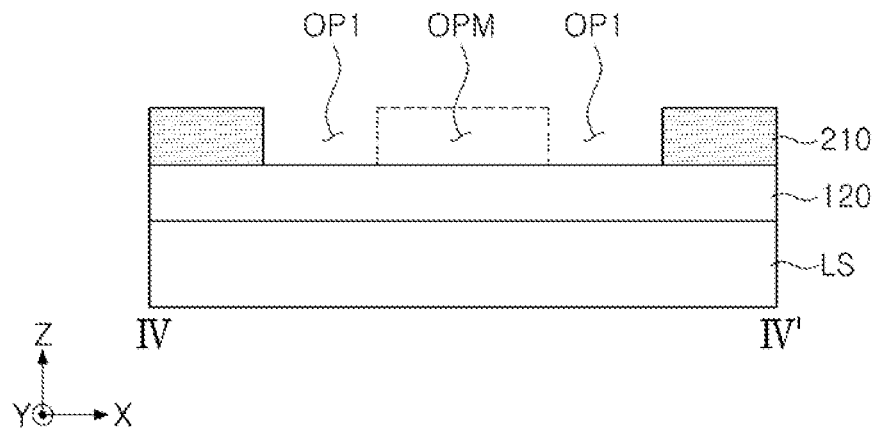
Figure 12C:
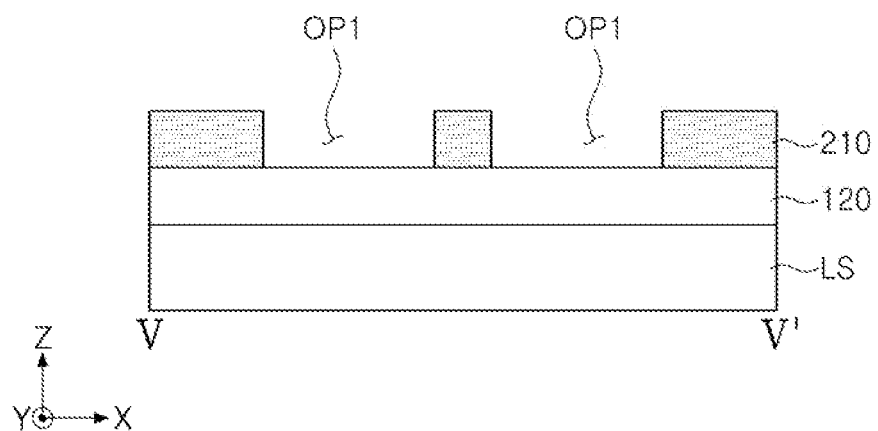

FIGS. 12A to 12C illustrate an operation of forming first openings in the mask layer (refer to operation S30 in FIGS. 18 and 19).

The lower mask layer 210 may be etched using the patterned first upper mask layer 220 to form first openings OP1 in the lower mask layer 210. The first openings OP1 may be formed to overlap at least a portion of the intermediate opening OPM.

The first openings OP1 may be regions in which the first metal wirings M1a and M1b of FIG. 1 will be formed by a subsequent process.

The first openings OP1 may be formed to extend in the Y-direction in the lower mask layer 210. The first openings OP1 may be formed to be spaced apart from each other along the X-direction. A length L of the first openings OP1 in the Y-direction may be greater than the width W1 in the Y-direction of the intermediate opening OPM.

The width W2 in the X-direction of the first openings OP1 may be smaller than or equal to the width W1 in the Y-direction of the intermediate opening OPM. Since the width W1 in the Y-direction of the intermediate opening OPM is greater than or equal to the width W2 in the X-direction of the first openings OP1, in an operation of forming the spacer layer 215 (refer to operation S40 in FIG. 18, and FIGS. 13A to 13C, below), the spacer layer 215 may be formed so as not to block the entire intermediate opening OPM.

The first openings OP1 may be formed such that the intermediate opening OPM is disposed between the first openings OP1. The intermediate opening OPM may be formed to be adjacent to the center of each of the first openings OP1, or, e.g., the intermediate opening OPM may be disposed to overlap an upper end of each of the first openings OP1 on a plane. When the first openings OP1 are formed such that the intermediate opening OPM overlaps the upper end of each of the first openings OP1, the semiconductor device described with reference to FIG. 8 may be formed.

Next, the first upper mask layer 220 may be removed.

Figure 13A:
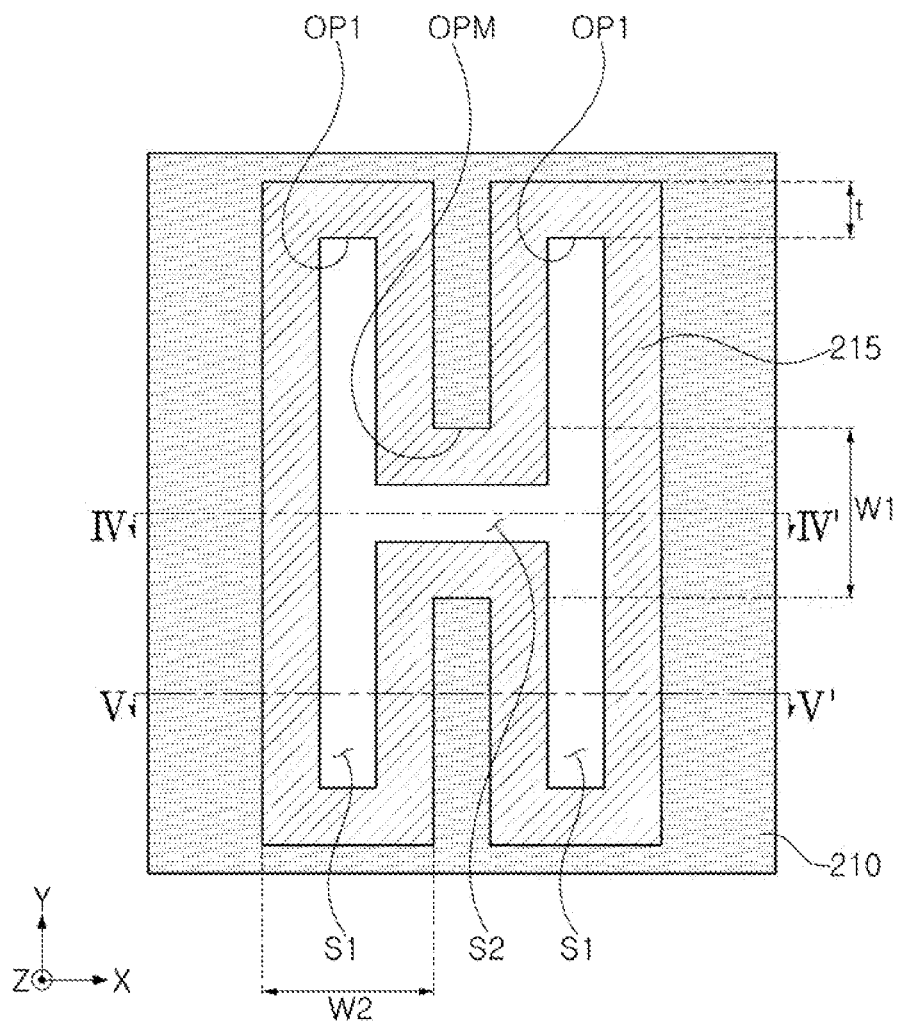
Figure 13B:
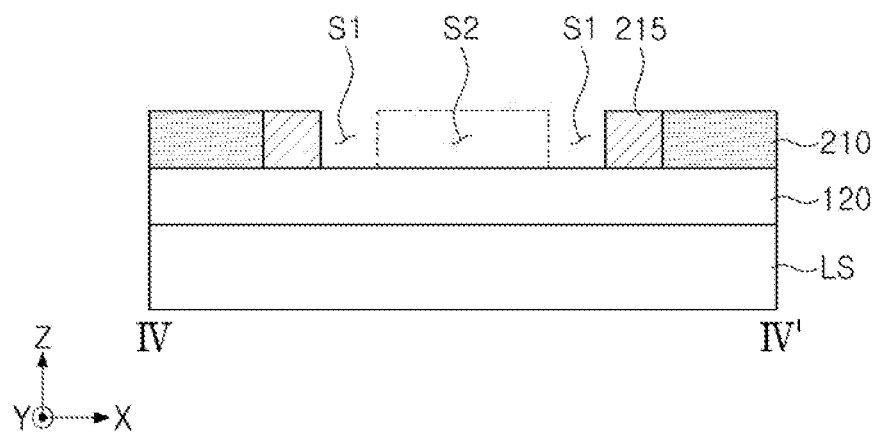
Figure 13C:
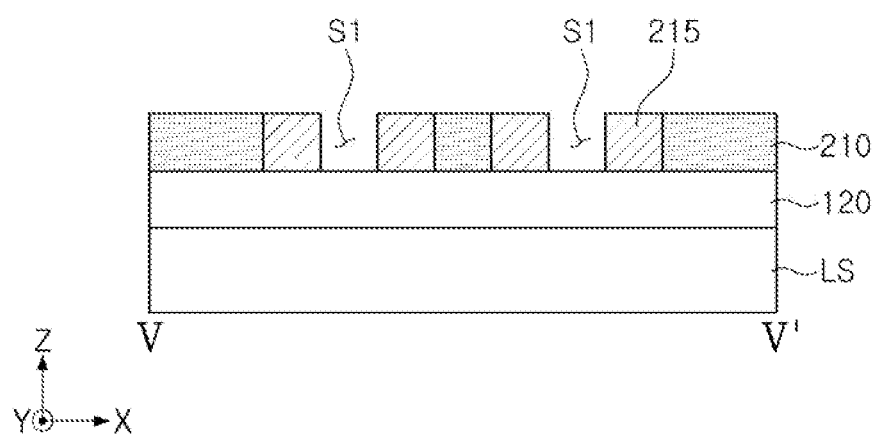

FIGS. 13A to 13C illustrate an operation of forming the spacer layer 215 on the sidewall of the lower mask layer 210 (refer to operation S40 in FIGS. 18 and 19).

The spacer layer 215 may be formed on a sidewall of the lower mask layer 210 to be positioned in a partial region within each of the intermediate opening OPM and the first openings OP1.

The spacer layer 215 may be formed in the first openings OP1 and the intermediate opening OPM. For example, the spacer layer 215 may be formed in portions of the intermediate opening OPM and the first opening OP1 such that the intermediate opening OPM and the first opening OP1 remain connected to each other. For example, the spacer layer 215 may be formed on a sidewall of the lower mask layer 210 exposed by each of the first openings OP1 and the intermediate opening OPM such that the first openings OP1 and the intermediate opening OPM include empty spaces S1 and S2, respectively.

The first spaces S1 (except for a region in which the spacer layer 215 is disposed) may be formed in the first openings OP1.

For the second space S2, the width tin the Y-direction of the spacer layer 215 may be less than half the width W1 in the Y-direction of the intermediate opening OPM. Since the width W1 in the Y-direction of the intermediate opening OPM is greater than about twice the width t of the spacer layer 215 in the Y-direction, the second space S2 may be formed in the inside of the intermediate opening OPM after the spacer layer 215 is formed.

The first spaces S1 of the first openings OP1 may each be connected to the second space S2 of the intermediate opening OPM such that all of the first and second spaces S1 and S2 are connected to each other.

The spacer layer 215 may be formed by stacking a spacer material along a sidewall of the lower mask layer 210 and an upper surface of the dielectric layer 120, exposed by the first openings OP1 and the intermediate opening OPM, respectively, and partially etching the same to expose the upper surface of the dielectric layer 120. The spacer layer 215 may include a material having an etch selectivity to the lower mask layer 210. For example, the spacer layer 215 may include silicon oxide, silicon nitride, titanium oxide, or aluminum oxide.

Figure 14A:
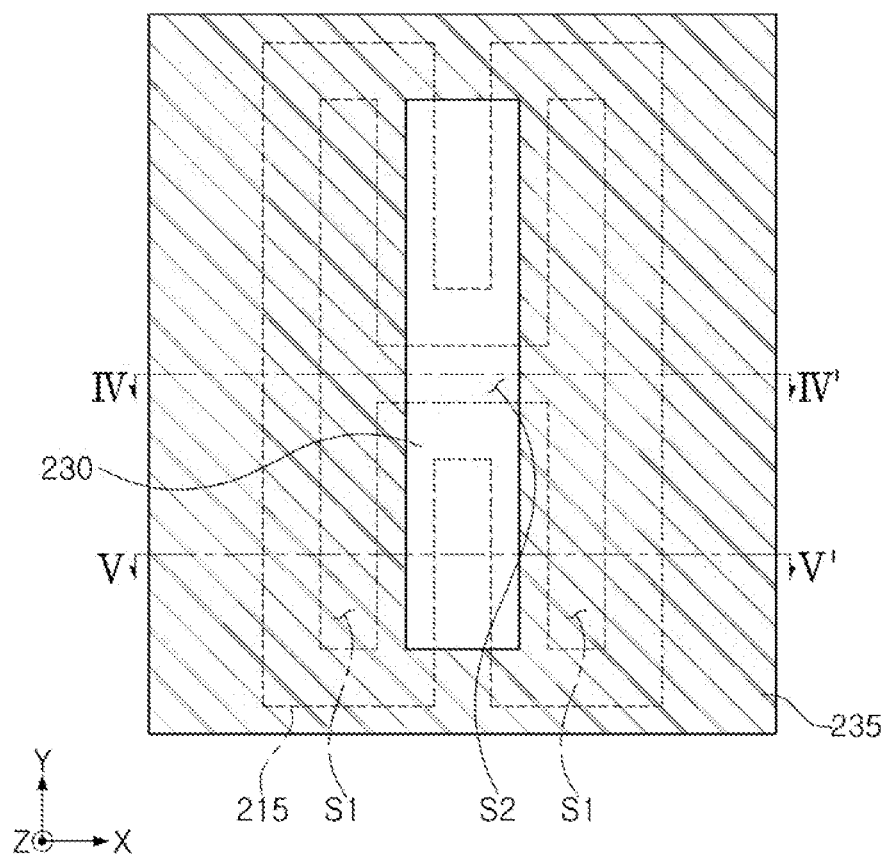
Figure 14B:
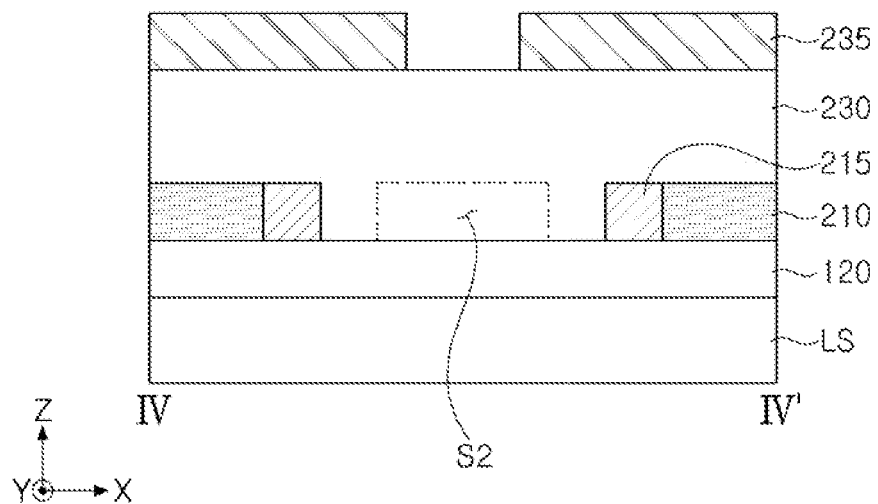
Figure 14C:
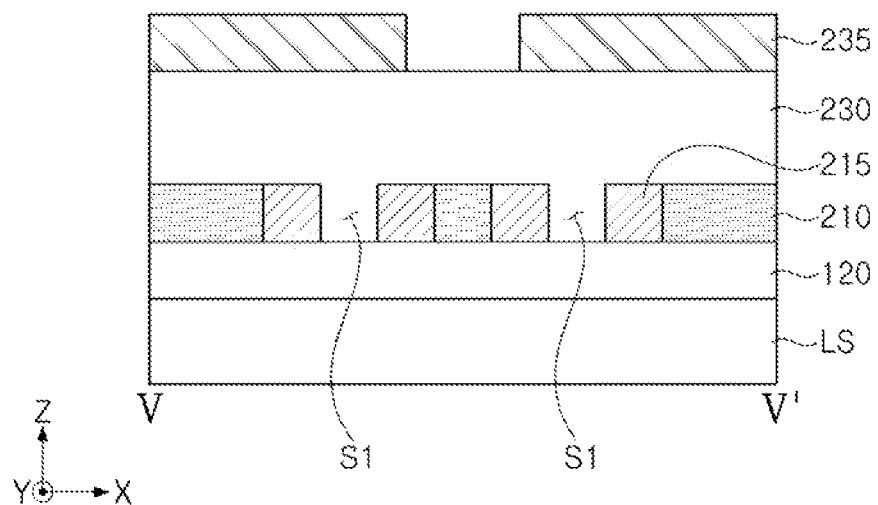

FIGS. 14A to 14C illustrate an operation of forming a second upper mask layer for forming a second opening.

A second upper mask layer 230 may be formed on the lower mask layer 210, which has the first spaces S1 of the first openings and the second space S2 of the intermediate opening. The second upper mask layer 230 is illustrated as one layer, but second upper mask layer 230 may be formed of a plurality of layers.

Next, a second photosensitive insulating pattern layer 235 may be formed on the second upper mask layer 230. The second photosensitive insulating pattern layer 235 may include an opening in a position that corresponds to positions in which second openings OP2 (described with reference to FIGS. 15A to 15C, below) will be formed. The opening in the photosensitive insulating pattern layer 235 may extend in the Y-direction. A width in the X-direction of the opening in the photosensitive insulating pattern layer 235 may be greater than a distance between adjacent spacer layers 215 along the X-direction.

Next, the second upper mask layer 230 may be etched using the second photosensitive insulating pattern layer 235 as a mask pattern (not shown).

Figure 15A:
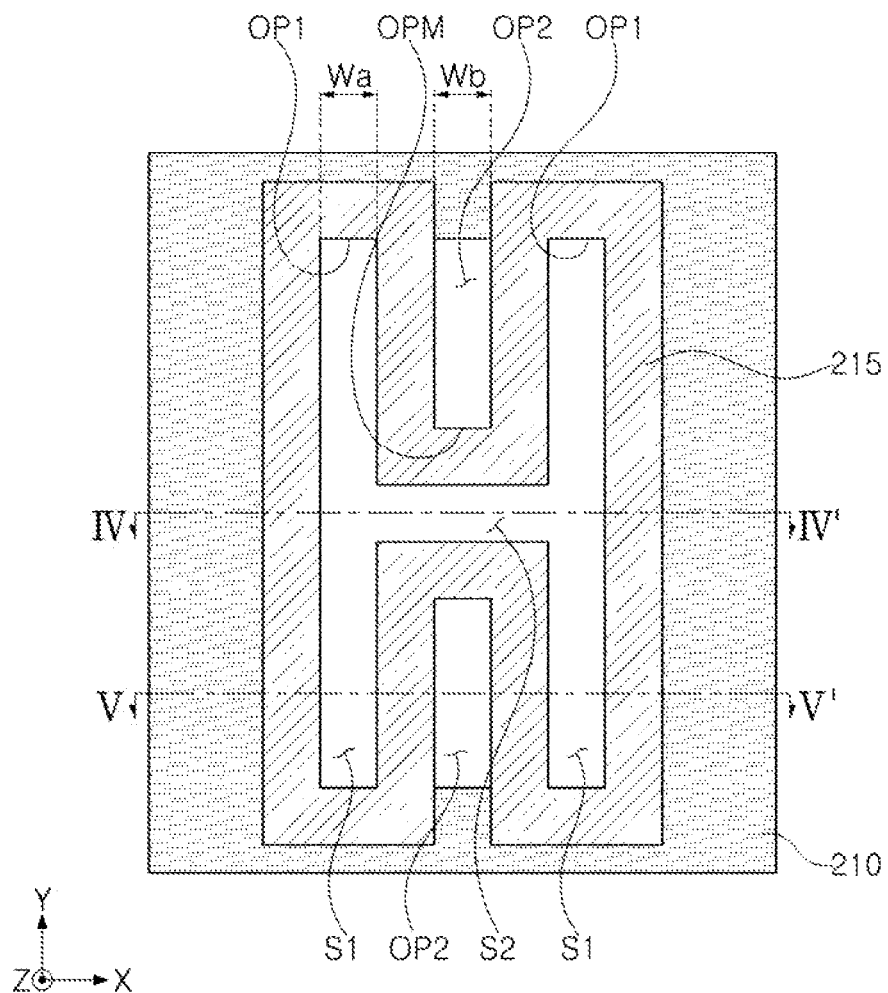
Figure 15B:
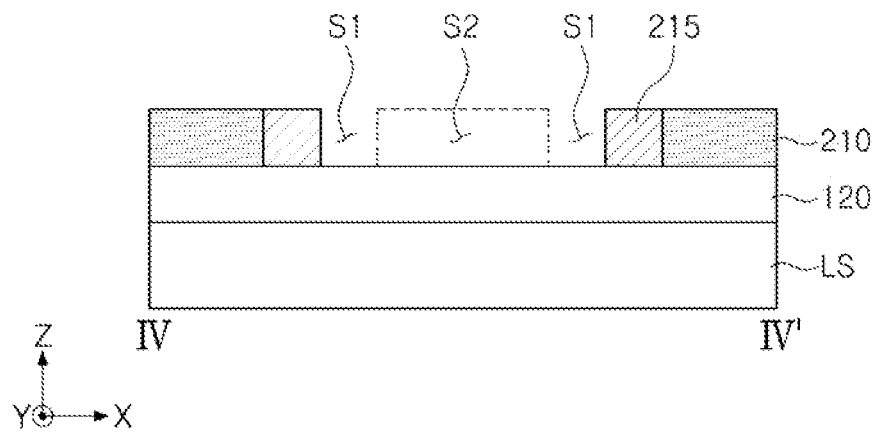
Figure 15C:
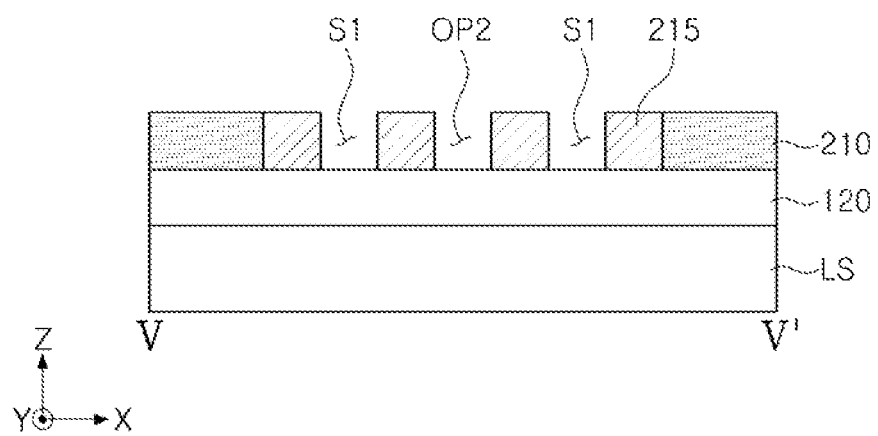

FIGS. 15A to 15C illustrate an operation of forming the second openings OP2 in the mask layer 210 (refer to operation S45 in FIG. 19).

The second openings OP2 may be formed to be spaced apart from each other along the Y-direction in the lower mask layer 210. The second openings OP2 may be formed by etching the lower mask layer 210 using the patterned second upper mask layer 230.

The second openings OP2 may be regions in which the second metal wirings I1 of FIG. 1 will be formed by a subsequent process.

The second openings OP2 may be formed to be spaced apart from each other along the Y-direction by the intermediate opening OPM. The second openings OP2 may be spaced apart from each other along the Y-direction by the spacer layer 215 formed in the intermediate opening OPM.

The second openings OP2 may be formed to be disposed between the first openings OP1 adjacent to each other. The second openings OP2 may be formed to be disposed between the spacer layers 215 disposed in the first openings OP1. The second openings OP2 may be self-aligned by the spacer layer 215.

A width Wb in the X-direction of the second openings OP2 may be substantially the same as a width of an area excluding the spacer layer 215 in the first openings OP1, e.g., the width Wa in the X-direction of the first space S1.

After the second openings OP2 are formed, the second upper mask layer 230 may be removed.

In an implementation of the method, the forming of the second upper mask layer 230 and the forming of the second openings OP2 (operation S45) may be omitted.

Figure 16A:
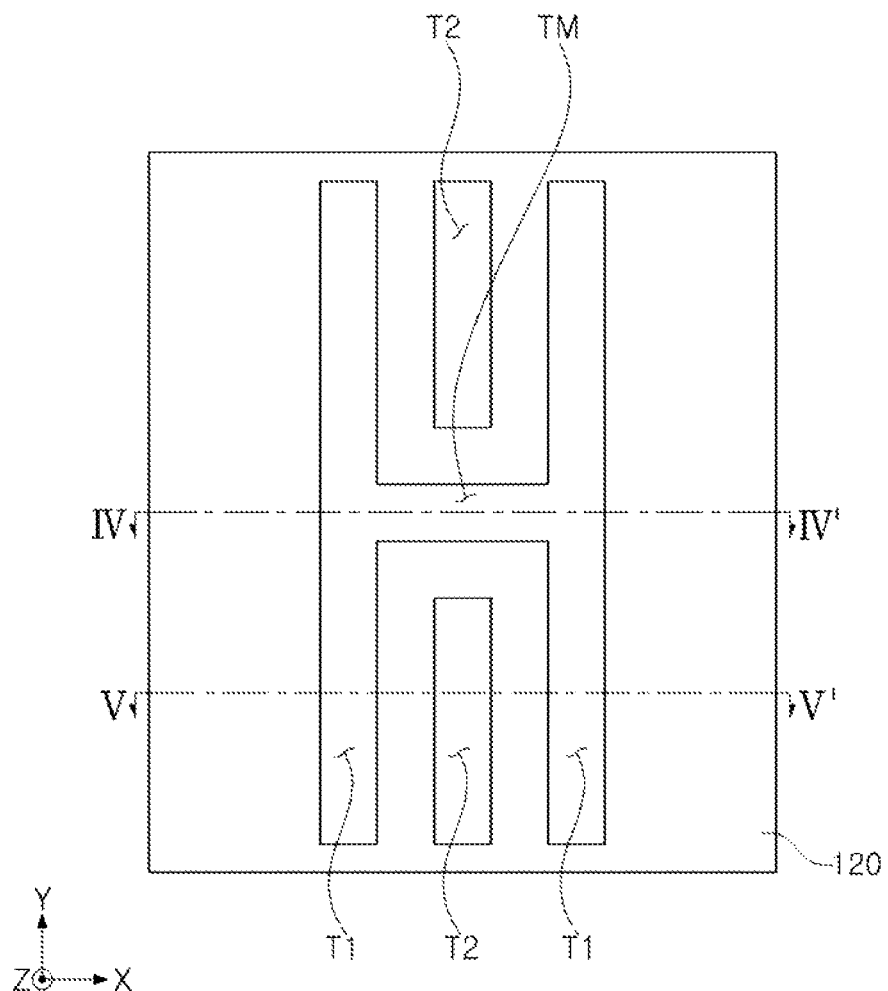
Figure 16B:
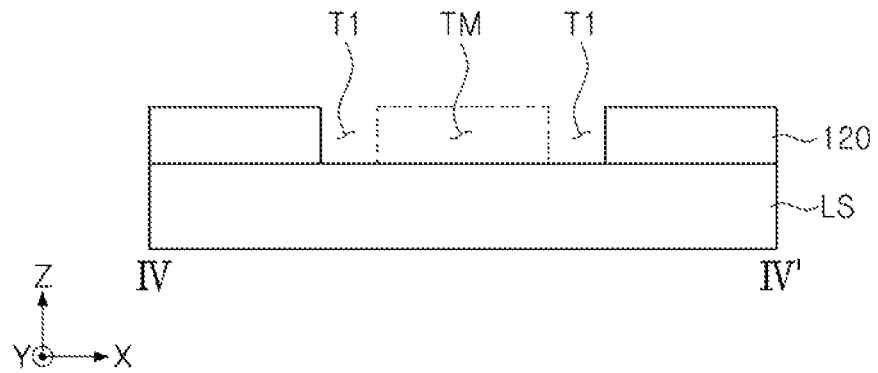
Figure 16C:
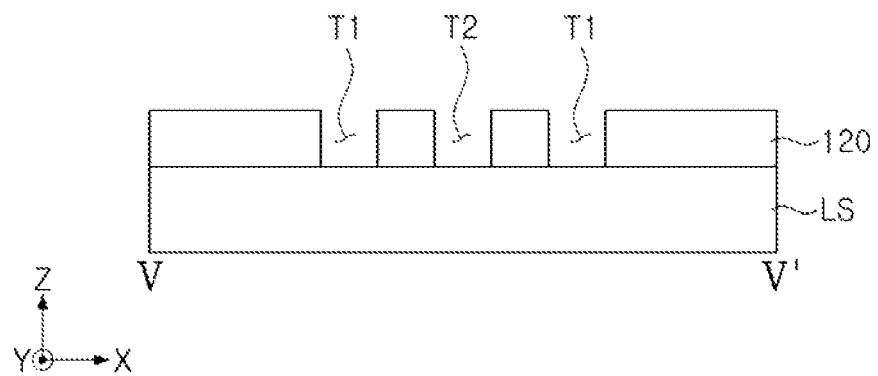

FIGS. 16A to 16C illustrate an operation of patterning the dielectric layer 120 using the lower mask layer 210 (refer to operation S50 in FIG. 18).

The dielectric layer 120 may be etched using the spacer layer 215 and the lower mask layer 210 as a mask. The dielectric layer 120 may be patterned along the first intermediate opening OPM, the first openings OP1, and the second openings OP2 described with reference to FIGS. 15A to 15C. The dielectric layer 120 may be patterned along the second space S2 of the first intermediate opening OPM, the first space S1 of the first openings OP1, and the second openings OP2 described with reference to FIGS. 15A to 15C.

In the dielectric layer 120, a region corresponding to the second space S2 of the first intermediate opening OPM is removed to form an intermediate opening TM of the dielectric layer 120, a region corresponding to the first space S1 of the first opening OP1 is removed to form a first opening T1 of the dielectric layer 120, and a region corresponding to the second opening OP2 may be formed as a second opening T2 of the dielectric layer 120.

Figure 17A:
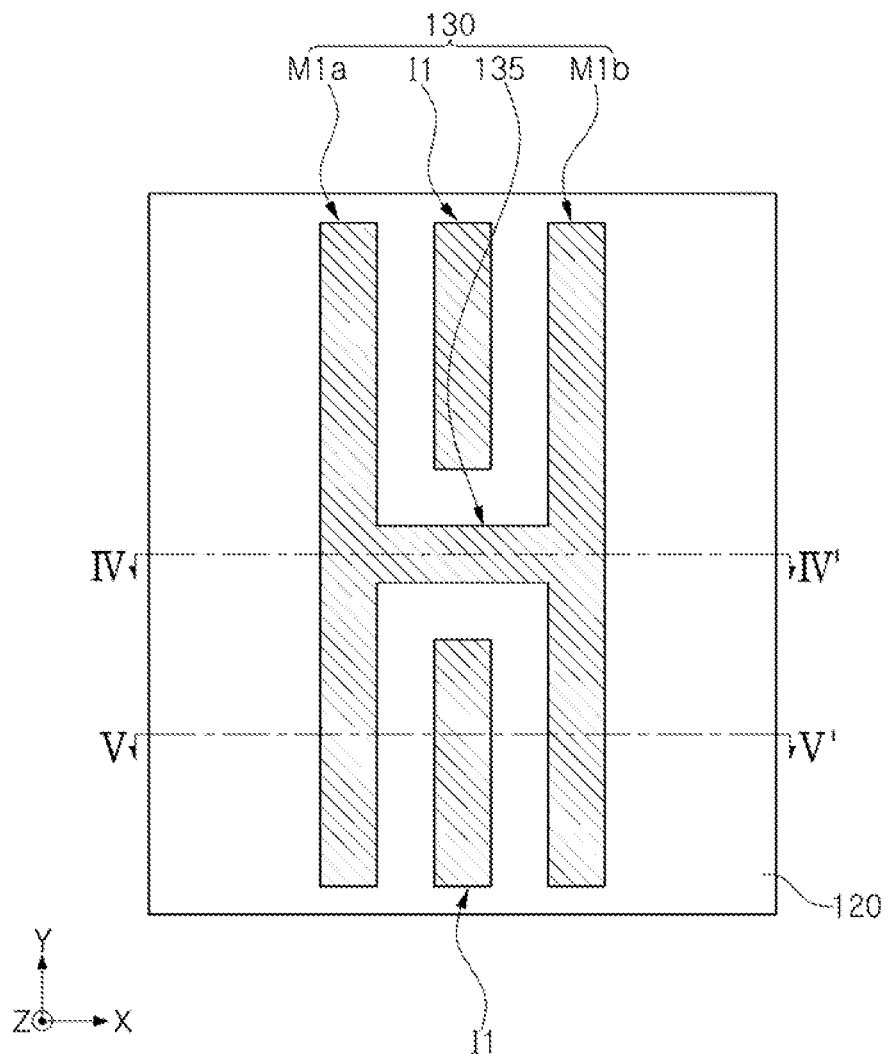
Figure 17B:
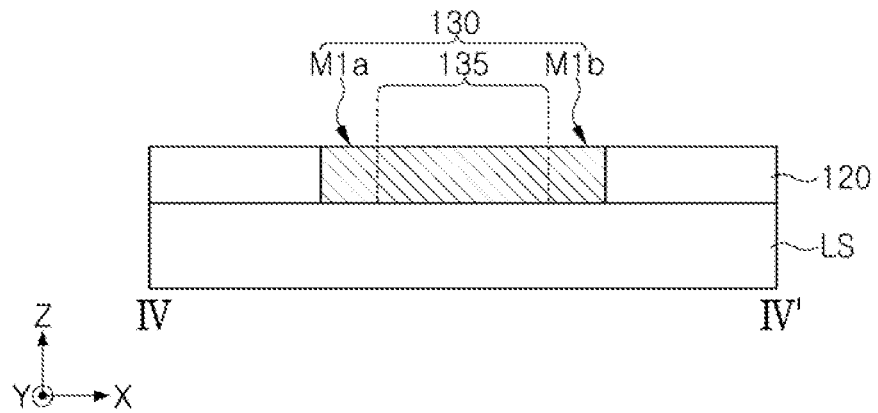
Figure 17C:
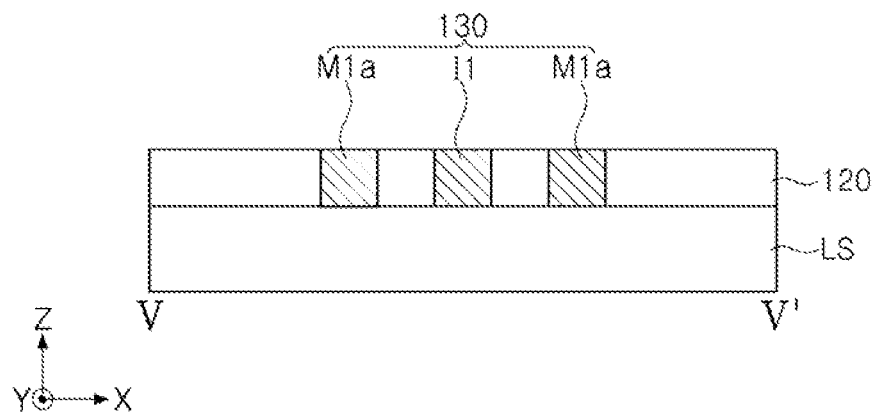

FIGS. 17A to 17C illustrate an operation of forming a metal material layer by filling, with a metal material, the region in which the dielectric layer 120 has been patterned (refer to operation S50 in FIGS. 18 and 19).

The metal material layer 130 may be formed by filling, with a metal material, the openings of the dielectric layer 120 described with reference to FIGS. 16A to 16C. The metal material layer 130 may include, e.g., a metal material such as ruthenium (Ru), molybdenum (Mo), cobalt (Co), aluminum (Al), or copper (Cu).

The metal material layer 130 may include first metal wirings M1a and M1b disposed to be spaced apart from each other along the X-direction, an intermediate metal wiring 135 connecting the first metal wirings M1a and M1b, and second metal wirings I1 spaced apart from each other along the Y-direction.

FIGS. 20A to 20E are diagrams illustrating a process sequence to describe a method of manufacturing the semiconductor device of FIG. 6 according to an example embodiment.

Hereinafter, the same description as described with reference to FIGS. 10A to 17C may be omitted.

Figure 20A:
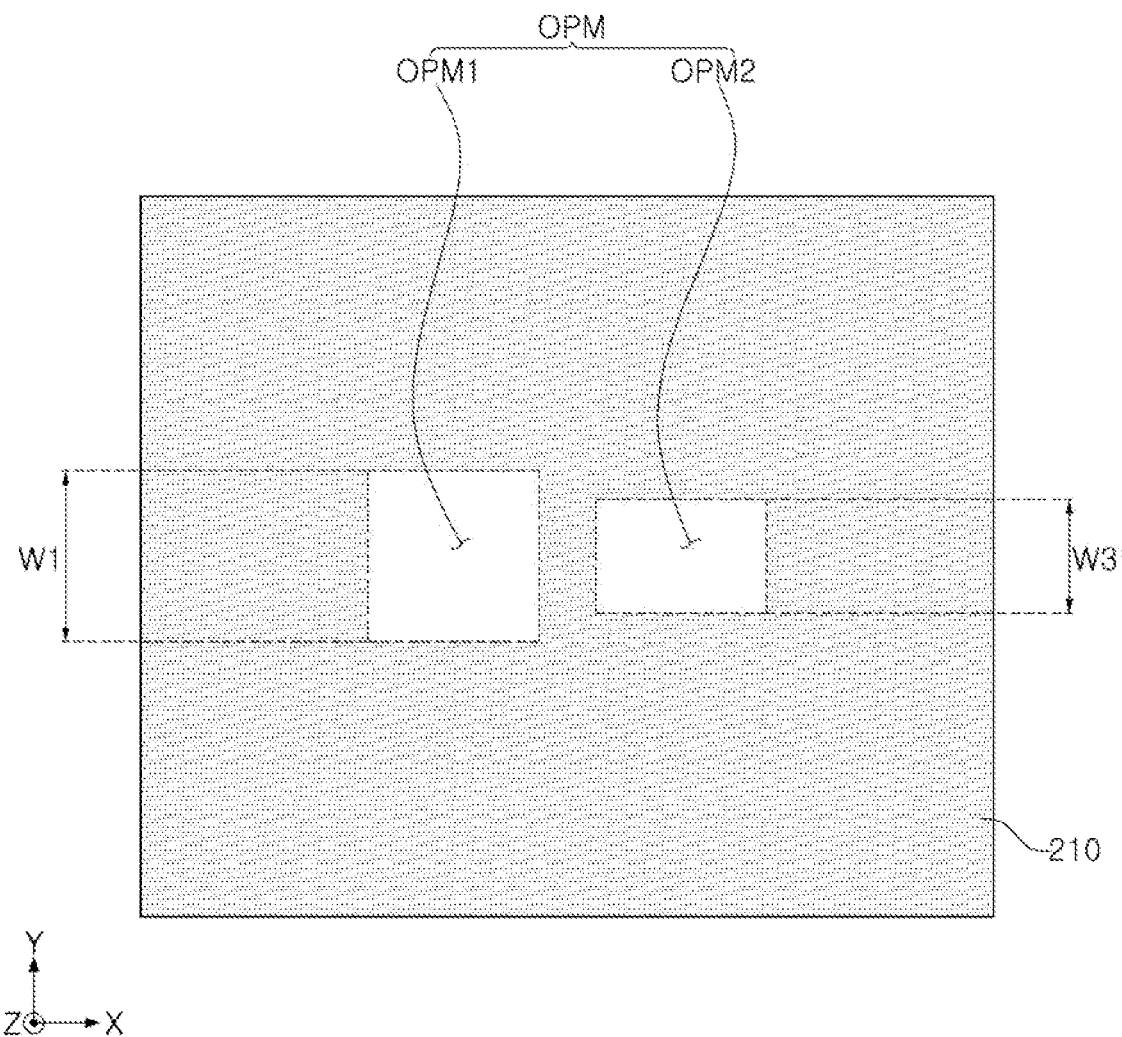
FIGS. 20A to 20E are diagrams illustrating a process sequence to illustrate a method of manufacturing a semiconductor device according to an example embodiment.

FIG. 20A illustrates an operation of forming the intermediate opening OPM to include intermediate openings OPM1 and OPM2 in the lower mask layer 210 (refer to operation S20 in FIGS. 18 and 19).

The intermediate openings OPM1 and OPM2 may be formed to have different widths in the lower mask layer 210 by the same method as described with reference to FIGS. 10A and 10B.

As described above, the intermediate opening OPM may include the first intermediate opening OPM1 and a second intermediate opening OPM2 having different widths. In another implementation, the lower mask layer 210 may include a plurality of intermediate openings OPM having substantially the same width.

The intermediate opening OPM may include a first intermediate opening OPM1, and a second intermediate opening OPM2 having a width W3 less than a width W1 of the first intermediate opening OPM1. The first width W1 in the Y-direction of the first intermediate opening OPM1 may be, for example, about 1.5 times or more a third width W3 in the Y-direction of the second intermediate opening OPM2. The first width W1 in the Y-direction of the first intermediate opening OPM1 may be, for example, about 1.5 times or more and about 3 times or less the third width W3 in the Y-direction of the second intermediate opening OPM2. The third width W3 of the second intermediate opening OPM2 may be, for example, about ⅔ or less of the first width W1 of the first intermediate opening OPM1.

The first intermediate opening OPM1 may be formed in a region corresponding to the region in which the intermediate metal wiring 135 of the metal material layer 130 described with reference to FIG. 6 is disposed.

The first intermediate opening OPM1 may be formed to have the width W1 in the Y-direction that is greater than about twice the width t in the Y-direction (refer to FIG. 20C) of the spacer layer 215 (refer to FIG. 20C, described below).

The first intermediate opening OPM1 may be formed to have a width W1 in the Y-direction that is greater than a width W2 in the X-direction of the first opening OP1 (refer to FIG. 20B, described below). The width W1 of the first intermediate opening OPM1 may be sufficiently wide to include an empty space in the first intermediate opening OPM1 after an operation of forming the spacer layer 215 (refer to FIG. 20C, described below). The width W3 in the Y-direction of second intermediate opening OPM2 may be sufficiently wide such that the entire second intermediate opening OPM2 is filled with a spacer material after the formation of the spacer layer 215 (refer to FIG. 20C, described below). The width W3 in the Y-direction of the second intermediate opening OPM2 may be width less than or equal to about twice the width t in the Y-direction of the spacer layer 215.

Figure 20B:
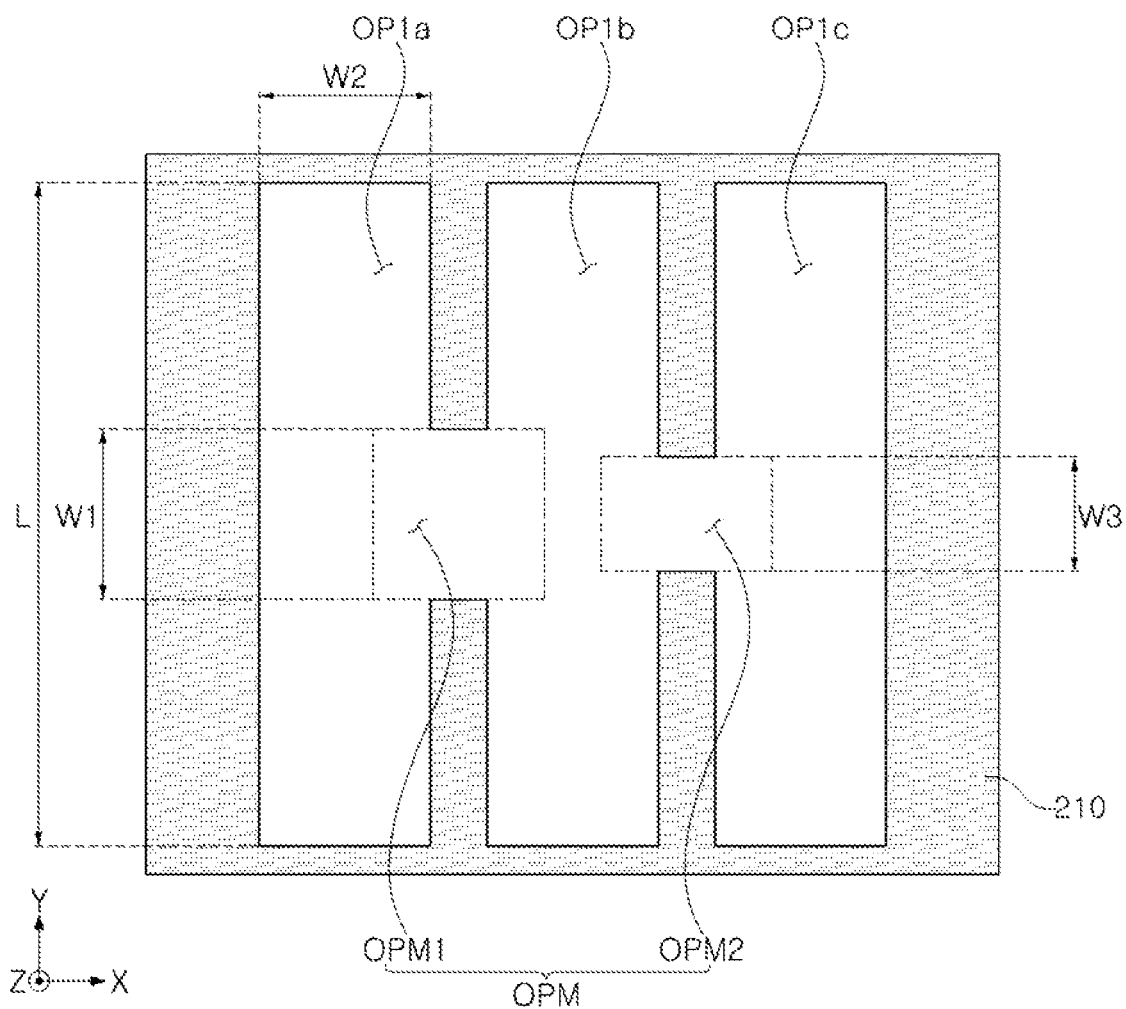

FIG. 20B illustrates an operation of forming first openings OP1a, OP1b, and OP1c in the lower mask layer 210 (refer to operation S30 in FIGS. 18 and 19).

The first openings OP1a, OP1b, and OP1c may be formed in the lower mask layer 210 by the same method as described with reference to FIGS. 12A to 12C.

The first openings OP1a, OP1b, and OP1c may be regions in which the first metal wirings M1a, M1b, and M1c of FIG. 6 are formed by a subsequent process.

The first openings OP1a, OP1b, and OP1c may be formed to extend along the Y-direction in the lower mask layer 210. The first openings OP1a, OP1b, and OP1c may be formed to be spaced apart from each other along the X-direction.

A length L in the Y-direction of the first openings OP1a, OP1b, and OP1c may be greater than the width W1 in the Y-direction of the first intermediate opening OPM1 and greater than the width W3 in the Y-direction of the second intermediate opening OPM2.

The width W2 in the X-direction of the first openings OP1a, OP1b, and OP1c may be less than or equal to the width W1 in the Y-direction of the first intermediate opening OPM1. Since the width W1 in the Y-direction of the first intermediate opening OPM1 is greater than or equal to the width W2 in the X-direction of the first openings OP1a, OP1b and OP1c, the spacer layer 215 (refer to FIG. 20C, described below) may be formed so as not to block the entire first intermediate opening OPM1 in the operation of forming the spacer layer 215.

The width W2 in the X-direction of the first openings OP1a, OP1b, and OP1c may be greater than the width W3 in the Y-direction of the second intermediate opening OPM2.

As described above in connection with FIG. 20A, the third width W3 may be, e.g., about ⅔ or less of the first width W1. Since the third width W3 of the second intermediate opening OPM2 is less than or equal to about ⅔ of the first width W1 of the first intermediate opening OPM1, in the operation of forming the spacer layer 215 (refer to FIG. 20C) to be described below, the entire area in the second intermediate opening OPM2 may be blocked by the spacer layer 215.

Figure 20C:
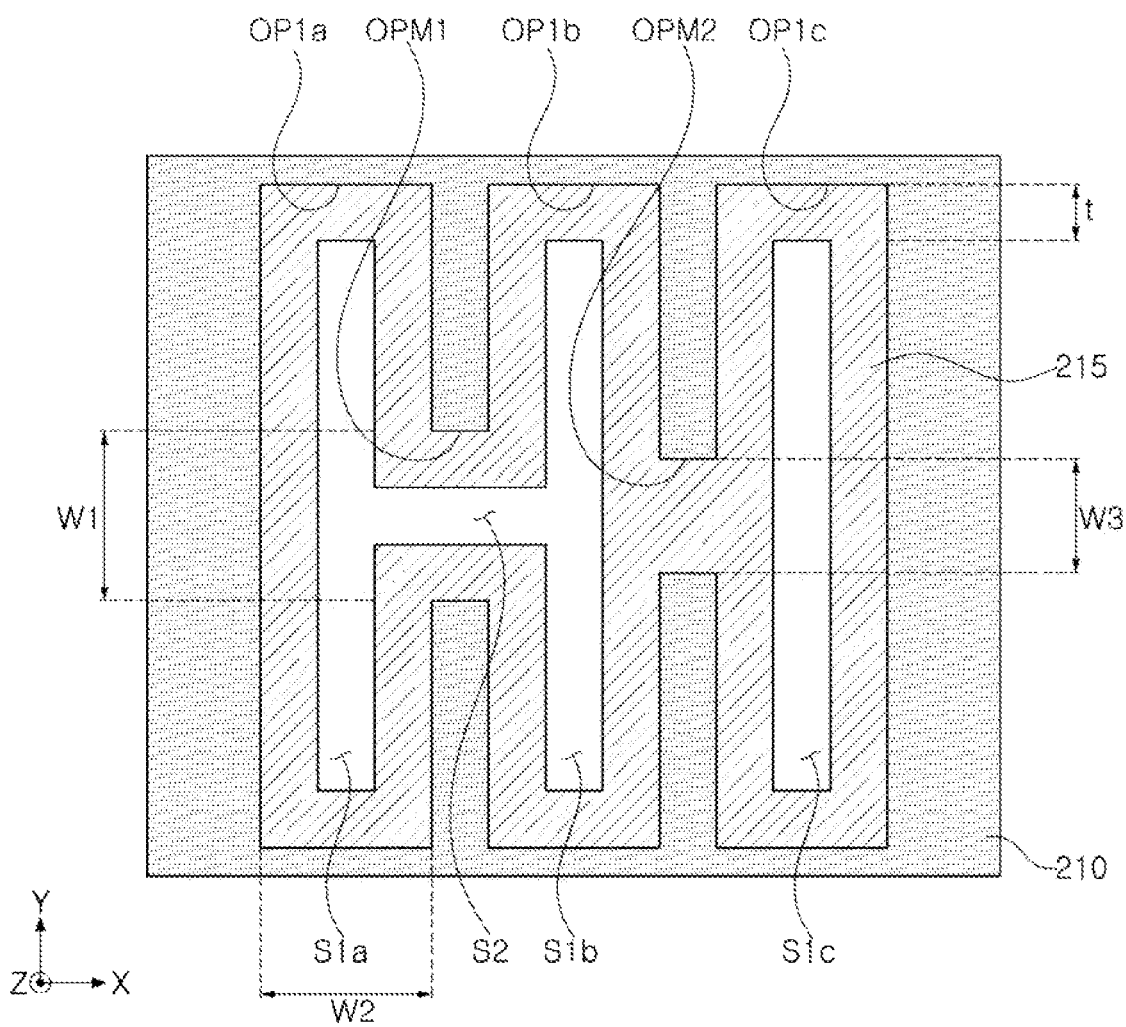

FIG. 20C illustrates the operation of forming the spacer layer 215 on the sidewall of the mask layer 210 (refer to operation S40 in FIGS. 18 and 19).

The spacer layer 215 may be formed in the first openings OP1a, OP1b, and OP1c. The spacer layer 215 may be formed by a method similar to that described with reference to FIGS. 13A to 13C.

The spacer layer 215 may be positioned in a partial region within each of the first intermediate opening OPM1 and the first openings OP1a, OP1b, and OP1c, and may be formed on a sidewall of the lower mask layer 210 to be positioned on the entire region within the second intermediate opening OPM2. The spacer layer 215 may be formed in portions of the first intermediate opening OPM1 and the first opening OP1 such that the first intermediate opening OPM1 and the first opening OP1 are connected to each other. The spacer layer 215 may be formed in the entire region of the second intermediate opening OPM2 such that the second intermediate opening OPM2 and the first opening OP1 are not connected to each other.

The spacer layer 215 may be formed along sidewalls of the lower mask layer 210 exposed by each of the first openings OP1a, OP1b and OP1c, the first intermediate opening OPM1, and the second intermediate opening OPM2. The first openings OP1a, OP1b, OP1c and the first intermediate opening OPM1 may be formed to include at least some empty spaces S1a, S1b, S1c, and S2, respectively. First spaces S1a, S1b and S1c, except for a region in which the spacer layer 215 is disposed, may be formed in the first openings OP1a, OP1b, and OP1c.

The width tin the Y-direction of the spacer layer 215 may be less than half the width W1 in the Y-direction of the first intermediate opening OPM. Since the width W1 in the Y-direction of the first intermediate opening OPM1 is greater than about twice the width tin the Y-direction of the spacer layer 215, a second space S2 may be formed inside the first intermediate opening OPM1 after the spacer layer 215 is formed.

As described above in connection with FIG. 20A, the width W3 in the Y-direction of the second intermediate opening OPM2 may be width less than or equal to about twice the width tin the Y-direction of the spacer layer 215. Since the width W3 in the Y-direction of the second intermediate opening OPM2 is less than or equal to about twice the width tin the Y-direction of the spacer layer 215, the entire region of the second intermediate opening OPM2 may be filled by the spacer layer 215.

The first spaces S1 of the first openings OP1a and OP1b overlapping one first intermediate opening OPM1 and adjacent to each other may be connected to the second space S2 of the first intermediate opening OPM1 each other. The first openings OP1b and OP1c overlapping one second intermediate opening OPM2 and adjacent to each other may be spaced apart from each other along the X-direction. The first openings OP1b and OP1c overlapping one second intermediate opening OPM2 and adjacent to each other may be spaced apart from each other by the spacer layer 215.

Figure 20D:
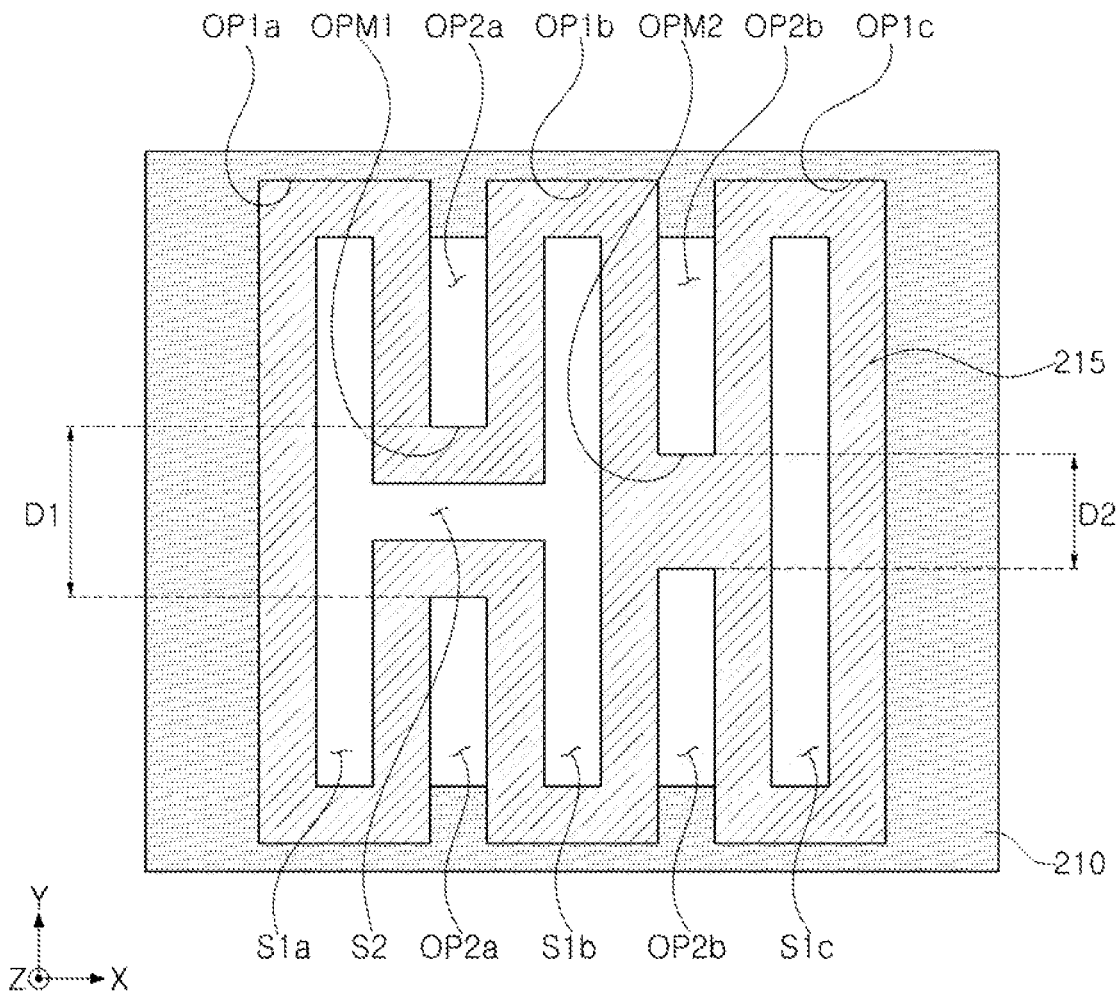

FIG. 20D illustrates an operation of forming second openings OP2a and OP2b in the mask layer 210 (refer to operation S45 in FIG. 19).

Second openings OP2a spaced apart from each other along the Y-direction and fourth openings OP2b spaced apart from each other along the Y-direction may be formed in the lower mask layer 210. The second openings OP2a and the fourth openings OP2b may be formed by a method similar to that described with reference to FIGS. 15A to 15C.

The second openings OP2a may be regions in which the second metal wirings I1a of FIG. 6 are formed by a subsequent process. The fourth openings OP2b may be regions in which the third metal wirings I1b of FIG. 6 are formed by a subsequent process.

The second openings OP2a may be formed to be spaced apart from each other along the Y-direction by the first intermediate opening OPM1 including the second space S2.

The fourth openings OP2b may be spaced apart from each other by the spacer layer 215 filling the entire second intermediate opening OPM2.

A distance D2 between the fourth openings OP2b may be less than a distance D1 between the second openings OP2a.

In an example embodiment, the second openings OP2a may be formed to be disposed between the first openings OP1a and OP1b adjacent to each other. The fourth openings OP2b may be formed to be disposed between the first openings OP1b and OP1c adjacent to each other. The second openings OP2a may be formed to be disposed between the spacer layers 215 disposed in the first openings OP1a and OP1b. The fourth openings OP2b may be formed to be disposed between the spacer layers 215 disposed in the first openings OP1b and OP1c. The second openings OP2a and the fourth openings OP2b may be self-aligned by the spacer layer 215.

In an implementation of the method, operation S45 of forming the second opening OP2 may be omitted.

Figure 20E:
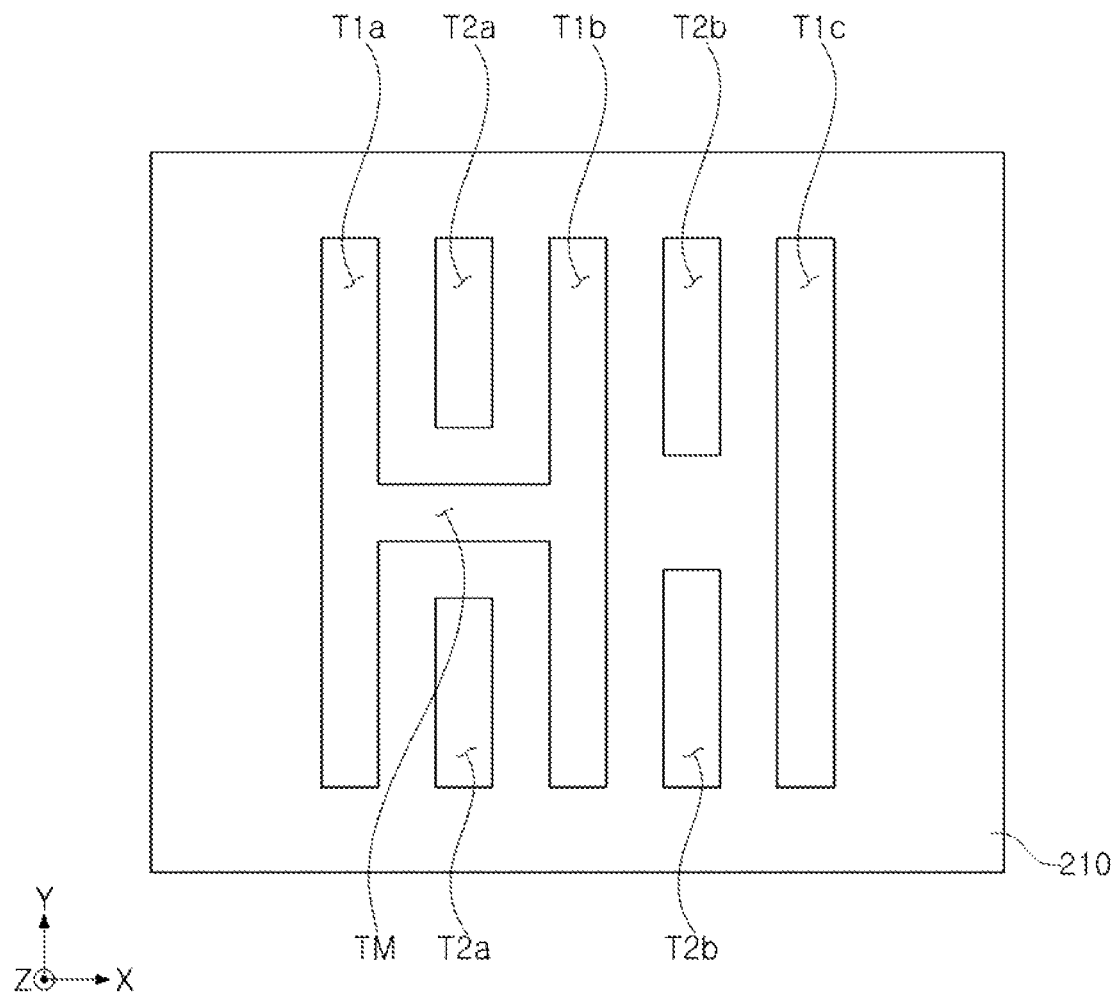

FIG. 20E illustrates the operation of patterning the dielectric layer 120 using the lower mask layer 210 (refer to operation S50 in FIG. 18).

The dielectric layer 120 may be patterned along the first intermediate opening OPM1, the first openings OP1a, OP1b and OP1c, the second openings OP2a, and the fourth openings OP2b described with reference to FIG. 20D. The dielectric layer 120 may be patterned along the second space S2 of the first intermediate opening OPM1, the first spaces S1a, S1b, and S1c of the first openings OP1a, OP1b and OP1c, and the second openings OP2 described with reference to FIG. 20D.

The dielectric layer 120 may be removed by the second space S2 of the first intermediate opening OPM1 to form the intermediate opening TM of the dielectric layer 120, removed by the first spaces S1a, S1b, and S1c of the first openings OP1a, OP1b, and OP1c to form first openings T1a, T1b, T1c of the dielectric layer 120, removed by the second openings OP2a to form a second opening T2a of the dielectric layer 120, and removed by the fourth openings OP2b to form a third opening T2b of the dielectric layer 120.

Next, referring again to FIG. 6, the metal material layer 130 may be formed by filling the openings of the patterned dielectric layers 120 with a metal material.

FIGS. 21A to 21D are diagrams illustrating a process sequence to describe a method of manufacturing the semiconductor device of FIG. 9 according to an example embodiment.

Figure 21A:
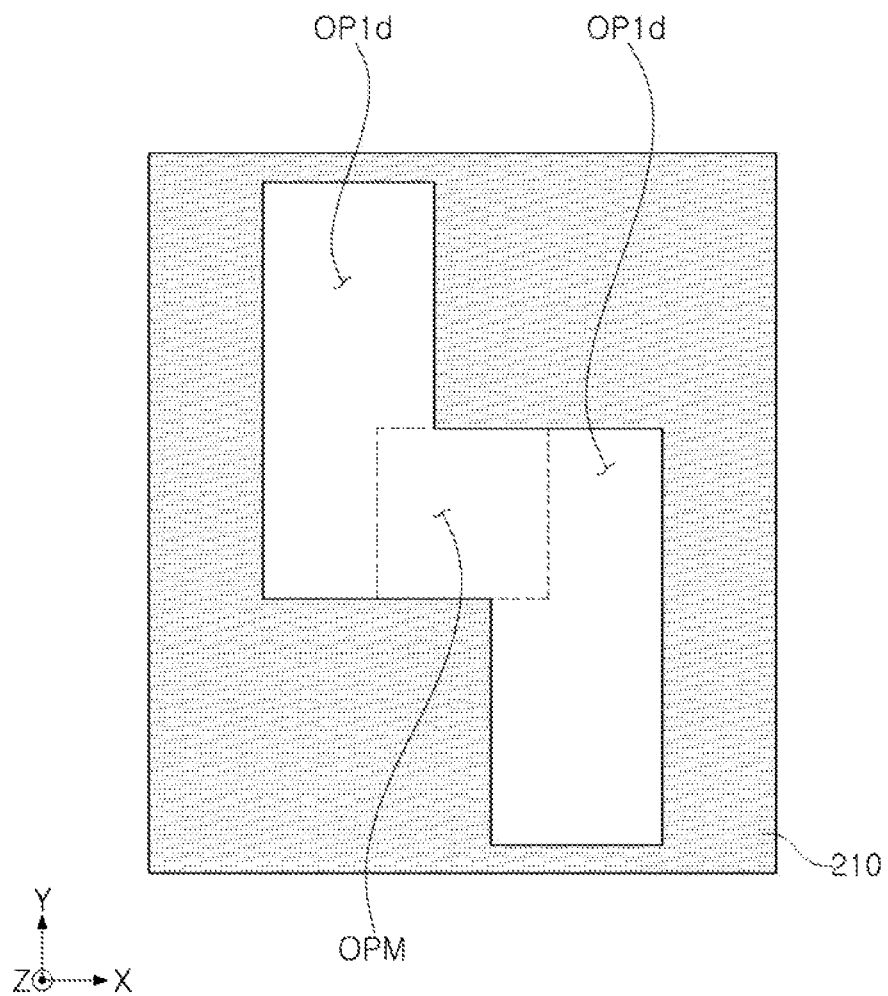
FIGS. 21A to 21D are diagrams illustrating a process sequence to illustrate a method of manufacturing a semiconductor device according to an example embodiment.

Referring to FIG. 21A, after forming the intermediate opening OPM described with reference to FIGS. 10A to 10C, first openings OP1d and OP1e may be formed. The first openings OP1d and OP1e may be formed by a method similar to that described with reference to FIGS. 12A to 12C.

In an example embodiment, the first openings OP1d and OP1e overlapping one intermediate opening OPM may be formed a first opening OP1d in which at least a portion of the lower region overlaps the intermediate opening OPM, and a first opening OP1e in which at least a portion of the upper region overlaps the intermediate opening OPM. Upper ends of each of the first openings OP1d and OP1e adjacent to each other may be disposed at different levels in the Y-axis direction. The first openings OP1d and OP1e may be formed such that the intermediate opening OPM is disposed between the first openings OP1d and OP1e.

Figure 21B:
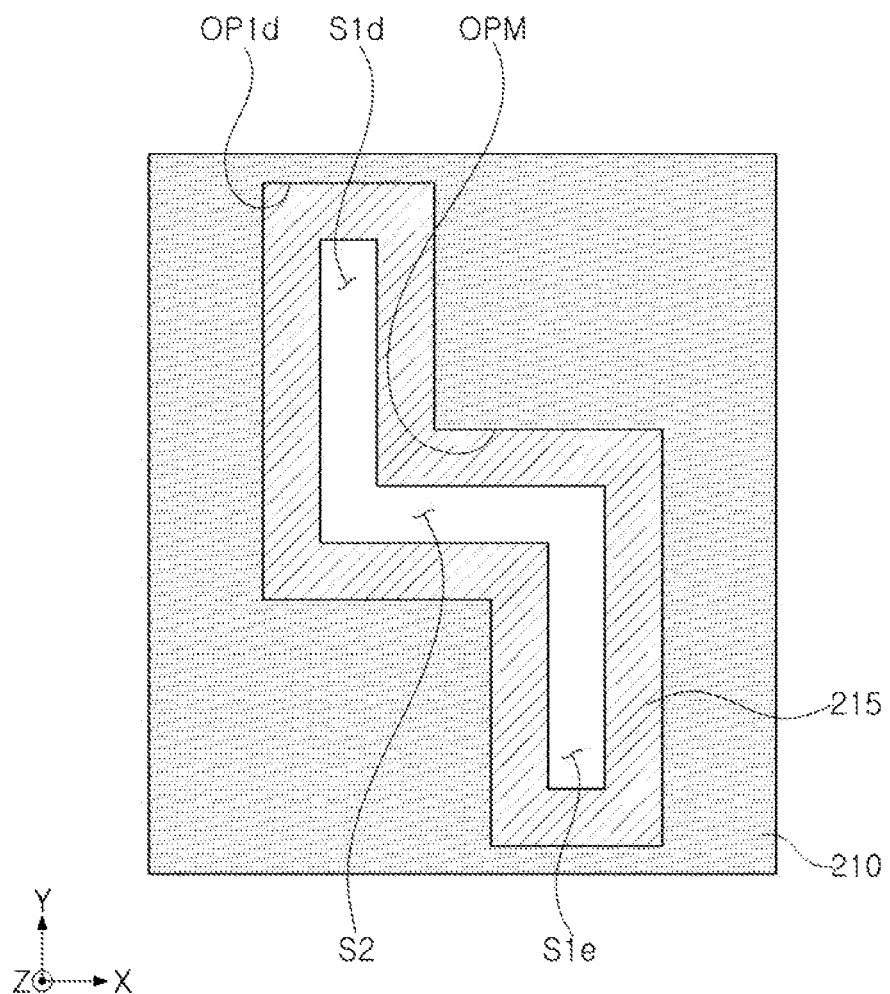

FIG. 21B illustrates the operation of forming the spacer layer 215 on the sidewall of the mask layer 210 (refer to operation S40 in FIGS. 18 and 19).

The spacer layer 215 may be formed by a method similar to that described with reference to FIGS. 13A to 13C.

The spacer layer 215 may be formed on a sidewall of the lower mask layer 210 to be positioned in a partial region within each of the intermediate opening OPM and the first openings OP1d and OP1e. The spacer layer 215 may be formed in portions of the intermediate opening OPM and the first openings OP1d and OP1e such that the intermediate opening OPM and the first openings OP1d and OP1e are connected to each other.

The spacer layer 215 may be formed on a sidewall of the lower mask layer 210 exposed by each of the first openings OP1d and OP1e and the intermediate opening OPM, and may be formed such that the first openings OP1d and OP1e and the intermediate opening OPM include empty spaces S1d, S1e, and S2, respectively. The first spaces S1d and S1e, except for a region in which the spacer layer 215 is disposed, may be formed in the first openings OP1d and OP1e. The second space S2 may be formed in the intermediate opening OPM. The first spaces S1d and S1e of the first openings OP1d and OP1e may be connected to the second space S2 of the intermediate opening OPM each other.

Figure 21C:
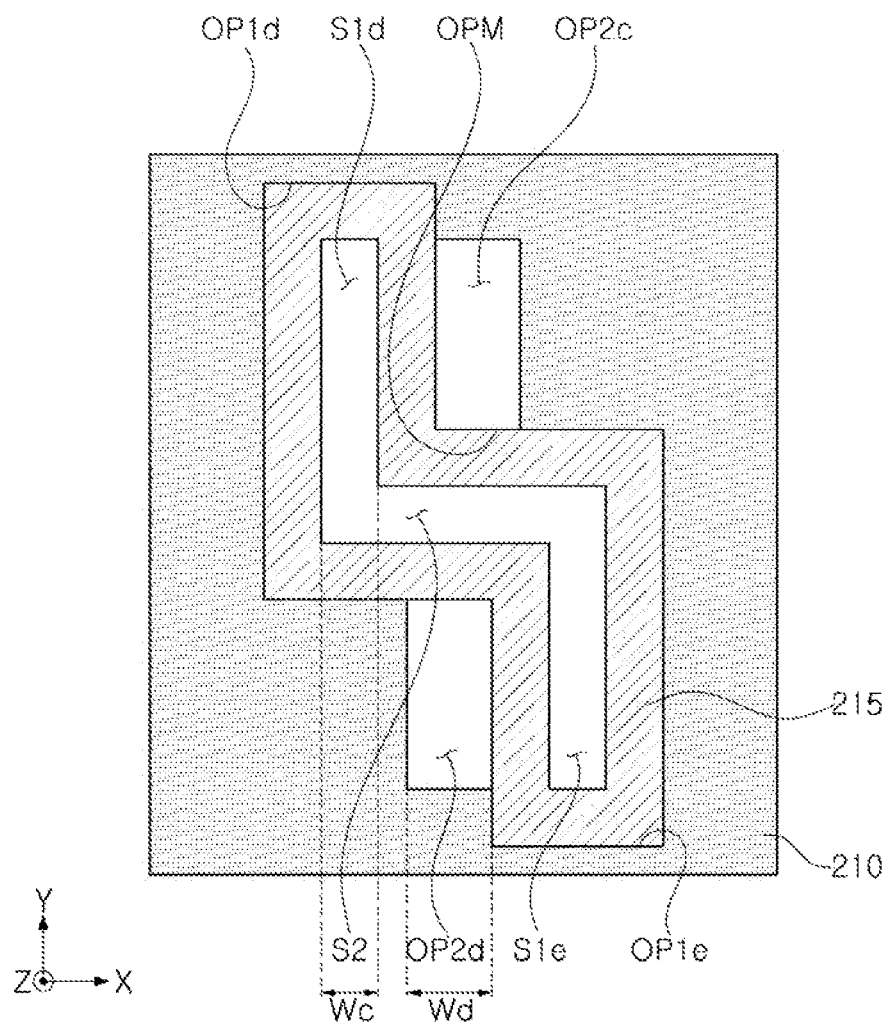

Referring to FIG. 21C, second openings OP2c and OP2d spaced apart from each other along the Y-direction may be formed in the lower mask layer 210. The second openings OP2c and OP2d may be formed by a method similar to that described with reference to FIGS. 15A to 15C.

The second openings OP2c and OP2d may be regions in which the second metal wirings I1s of FIG. 9 are formed by a subsequent process.

A width Wd in the X-direction of each of the second openings OP2c and OP2d may be greater than a width Wc in the X-direction of a region in the first openings OP1d and OP1e, excluding the spacer layer 215. For example, the width Wd of the second openings OP2c and OP2d may be greater than the width Wc of the first spaces S1d and S1e of the first openings OP1d and OP1e.

Figure 21D:
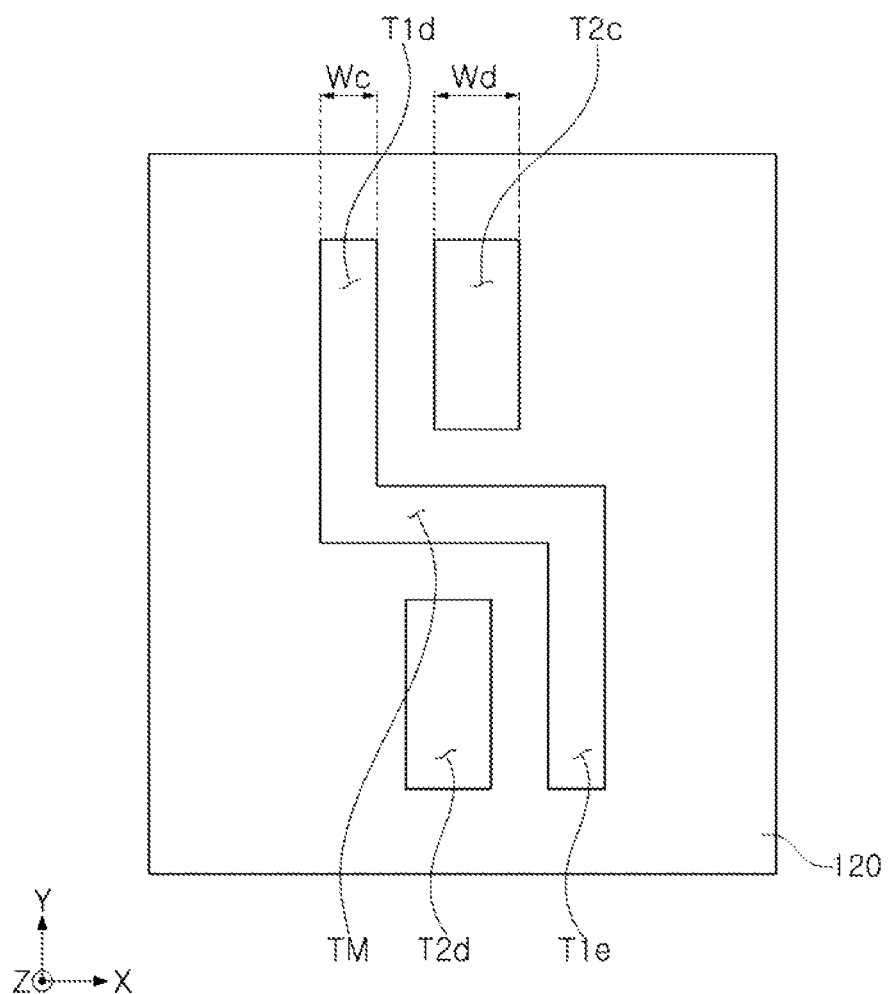

Referring to FIG. 21D, the dielectric layer 120 may be patterned along the intermediate opening OPM, the first openings OP1d and OP1e, and the second openings OP2c and OP2d described with reference to FIG. 21C. The dielectric layer 120 may be patterned along the second space S2 of the intermediate opening OPM, the first spaces S1d and S1e of the first openings OP1d and OP1e, and the second openings OP2c and OP2d described with reference to FIG. 21C.

In the dielectric layer 120, a region corresponding to the second space S2 of the intermediate opening OPM may be removed to form the intermediate opening TM of the dielectric layer 120, regions corresponding to the first spaces S1d and S1e of the first openings OP1d and OP1e may be removed to form first openings T1d and T1e of the dielectric layer 120, and regions corresponding to the second openings OP2c and OP2d may be removed to form second openings T2c and T2d of the dielectric layer 120. The second openings T2c and T2d of the dielectric layer 120 may be disposed to be shifted relative to each other along the X-direction. The width Wd in the X-direction of the second openings T2c and T2d of the dielectric layer 120 may be greater than the width We in the X-direction of the first opening T1d of the dielectric layer 120.

Next, referring to FIG. 9, the metal material layer 130 may be formed by filling the openings of the patterned dielectric layers 120 with a metal material.

As set forth above, embodiments may provide a semiconductor device having improved electrical characteristics by forming a metal portion that connects metal wirings that are disposed parallel to each other on the same plane and spaced apart from each other. Embodiments may provide a semiconductor device having improved electrical characteristics by forming intermediate metal wirings connecting between metal wirings spaced apart from each other on the same plane.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A method of manufacturing a semiconductor device, the method comprising:
providing a lower structure;

sequentially forming a dielectric layer and a mask layer having a first intermediate opening on the lower structure;

forming a first opening in the mask layer, the first opening extending in a first direction to at least partially overlap the first intermediate opening;

forming a spacer layer on a sidewall of the mask layer to be positioned in a portion of each of the first intermediate opening and the first opening;

forming second openings in the mask layer, the second openings being spaced apart from each other by the first intermediate opening along the first direction;

patterning the dielectric layer using the mask layer; and forming a metal material layer by filling a patterned region of the dielectric layer with a metal material, wherein in the first direction, the first intermediate opening has a first width, and the spacer layer has a second width that is less than half of the first width.

2. The method as claimed in claim 1, wherein the metal material layer includes:
a first metal wiring extending in the first direction, and
an intermediate metal wiring extending from the first metal wiring in a second direction, perpendicular to the first direction.

3. The method as claimed in claim 1, wherein:
the first opening is formed as a plurality of first openings, and the plurality of first openings are formed such that the first intermediate opening is disposed between the first openings, and
the second openings are formed between the spacer layers in the first openings adjacent to each other.

4. The method as claimed in claim 3, wherein the metal material layer includes:
first metal wirings extending in the first direction and spaced apart from each other, and an intermediate metal wiring connecting between the first metal wirings.

5. The method as claimed in claim 1, wherein a width of each of the second openings in a second direction, perpendicular to the first direction, is substantially equal to a width of a region except for the spacer layer in the first opening in the second direction.

6. The method as claimed in claim 1, wherein a width of each of the second openings in a second direction, perpendicular to the first direction, is greater than a width of a region excluding the spacer layer in the first opening in the second direction.

7. The method as claimed in claim 1, further comprising forming a second intermediate opening in the mask layer, the second intermediate opening having a third width in the first direction that less than the first width of the first intermediate opening.

8. The method as claimed in claim 7, wherein the first width of the first intermediate opening is about 1.5 or more times the third width of the second intermediate opening.

9. The method as claimed in claim 7, further comprising forming fourth openings in the mask layer, the fourth openings being spaced apart from each other by the spacer layer along the first direction.

10. The method as claimed in claim 9, wherein a distance between the fourth openings is less than a distance between the second openings.

11. The method as claimed in claim 9, wherein:
the first opening is formed as a plurality of first openings,
the second intermediate opening is formed to be disposed between the first openings, and
the fourth openings are formed between the spacer layers in the first openings.

12. The method as claimed in claim 1, wherein the lower structure includes:
a semiconductor substrate;
an active region extending in the first direction on the semiconductor substrate;
a plurality of channel layers on the active region and disposed to be spaced apart from each other along a direction that is perpendicular to an upper surface of the semiconductor substrate; and
a gate structure on the semiconductor substrate and extending in a second direction, perpendicular to the first direction, while intersecting the active region and the plurality of channel layers, the gate structure surrounding the plurality of channel layers.

13. A method of manufacturing a semiconductor device, the method comprising:
forming a mask layer having a first intermediate opening, on a dielectric layer;
forming a first opening in the mask layer, the first opening extending in a first direction to at least partially overlap the first intermediate opening and having a second width in a second direction, perpendicular to the first direction, that is equal to or less than a first width of the first intermediate opening in the first direction;
forming a spacer layer in portions of the first intermediate opening and the first opening to connect the first intermediate opening and the first opening to each other;
patterning the dielectric layer using the mask layer;
forming a metal material layer in a patterned region of the dielectric layer, the metal material layer including a first metal wiring extending along the first direction and an intermediate metal wiring extending from the first metal wiring in the second direction; and
forming a second intermediate opening in the mask layer, wherein:
the second intermediate opening has a third width that is less than or equal to about two-thirds of the first width of the first intermediate opening in the second direction;
the first opening is formed as a plurality of first openings that are spaced apart from each other along the second direction, and
the first openings are formed to overlap at least a portion of each of the first intermediate opening and the second intermediate opening.

14. The method as claimed in claim 13, wherein the spacer layer is formed to fill a portion of the first intermediate opening and an entirety of the second intermediate opening.

15. The method as claimed in claim 13, wherein a length of the first opening in the first direction is greater than the first width of the first intermediate opening.

16. The method as claimed in claim 13, wherein a width of the first metal wiring in the second direction is substantially equal to a width of the intermediate metal wiring in the first direction.

17. A method of manufacturing a semiconductor device, the method comprising:
forming an intermediate opening in a mask layer;
forming, in the mask layer, first openings extending in a first direction, spaced apart from each other along a second direction, perpendicular to the first direction, and at least partially overlapping the intermediate opening;

forming a spacer layer in the intermediate opening and the first openings, to at least partially include an empty space inside of each of the intermediate opening and the first openings; and forming second openings in the mask layer, the second openings being spaced apart from each other by the intermediate opening along the first direction, wherein:

the intermediate opening is disposed between the first openings adjacent to each other, and a width of the intermediate opening in the first direction is greater than about twice a width of the spacer layer in the first direction.

18. The method as claimed in claim 17, wherein each of the second openings is disposed between spacer layers in the first openings.

19. The method as claimed in claim 17, further comprising patterning a dielectric layer using the mask layer having the intermediate opening and the first openings.

\* \* \* \* \*